United States Patent
Hatada

(10) Patent No.: US 12,550,349 B2
(45) Date of Patent: Feb. 10, 2026

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hiroki Hatada, Kanazawa Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 365 days.

(21) Appl. No.: 18/234,344

(22) Filed: Aug. 15, 2023

(65) Prior Publication Data

US 2024/0313093 A1 Sep. 19, 2024

(30) Foreign Application Priority Data

Mar. 17, 2023 (JP) .................. 2023-042910

(51) Int. Cl.
*H10D 12/00* (2025.01)
*H10D 62/60* (2025.01)
*H10D 64/27* (2025.01)

(52) U.S. Cl.
CPC ........... *H10D 12/481* (2025.01); *H10D 62/60* (2025.01); *H10D 64/513* (2025.01)

(58) Field of Classification Search
CPC ..... H10D 12/481; H10D 62/60; H10D 64/513
USPC ........................................................ 257/288
See application file for complete search history.

(56) References Cited

U.S. PATENT DOCUMENTS

| | | | |
|---|---|---|---|
| 6,191,447 B1* | 2/2001 | Baliga | H10D 8/60 |
| | | | 257/330 |
| 6,285,060 B1* | 9/2001 | Korec | H10D 30/668 |
| | | | 257/E29.066 |
| 6,551,881 B1 | 4/2003 | Letavic | |
| 6,787,848 B2 | 9/2004 | Ono et al. | |
| 6,809,375 B2 | 10/2004 | Takemori et al. | |
| 2012/0241814 A1 | 9/2012 | Kamata et al. | |

(Continued)

FOREIGN PATENT DOCUMENTS

| | | |
|---|---|---|
| JP | 2002-299619 A | 10/2002 |
| JP | 2003-017696 A | 1/2003 |
| JP | 2005-505138 A | 2/2005 |

(Continued)

*Primary Examiner* — Igwe U Anya
(74) *Attorney, Agent, or Firm* — Kim & Stewart LLP

(57) ABSTRACT

A semiconductor device according to an embodiment includes: a first semiconductor region of a first conductivity type disposed; a second semiconductor region of a second conductivity type disposed on the first region; a third semiconductor region of the first conductivity type disposed on the second region; an insulating film disposed in the first, second and third regions; and a second electrode disposed in the insulating film so as to be adjacent to the second region via the insulating film. The second region includes a boundary region that is in contact with the insulating film and faces the second electrode, the boundary region includes a high-concentration region, the insulating film includes a first region in contact with the high-concentration region and a second region in contact with a low-concentration region, and a thickness of the second region is smaller than a thickness of the first region.

19 Claims, 31 Drawing Sheets

(56) References Cited

U.S. PATENT DOCUMENTS

2016/0093728 A1* 3/2016 Decker ............... H10D 30/665
    438/270
2018/0097102 A1  4/2018 Baba et al.

FOREIGN PATENT DOCUMENTS

| JP | 4924781 B2    | 4/2012  |
|----|---------------|---------|
| JP | 2012-204377 A | 10/2012 |
| JP | 2012-216675 A | 11/2012 |
| JP | 2018-056463 A | 4/2018  |

* cited by examiner

SEMICONDUCTOR DEVICE

CROSS-REFERENCE TO RELATED APPLICATIONS

This application is based upon and claims the benefit of priority from the prior Japanese Patent Application No. 2023-042910, filed on Mar. 17, 2023; the entire contents of which are incorporated herein by reference.

FIELD

Embodiments described herein relate generally to a semiconductor device.

BACKGROUND

A semiconductor device having a trench gate structure in which a gate electrode is embedded in a groove formed in a semiconductor layer is known. In such a semiconductor device, the channel resistance is one of main factors that affect the on-resistance (Ron). In order to reduce the channel resistance, it is conceivable to perform design ingenuity such as lowering the threshold voltage Vth or shortening the length (channel length) of the base region.

However, when the threshold voltage Vth is lowered, the risk of malfunction of the semiconductor device increases. In addition, in a case where the channel length is shortened, a short channel effect is caused, and the reliability of the semiconductor device is deteriorated.

DETAILED DESCRIPTION

Figure 1A:
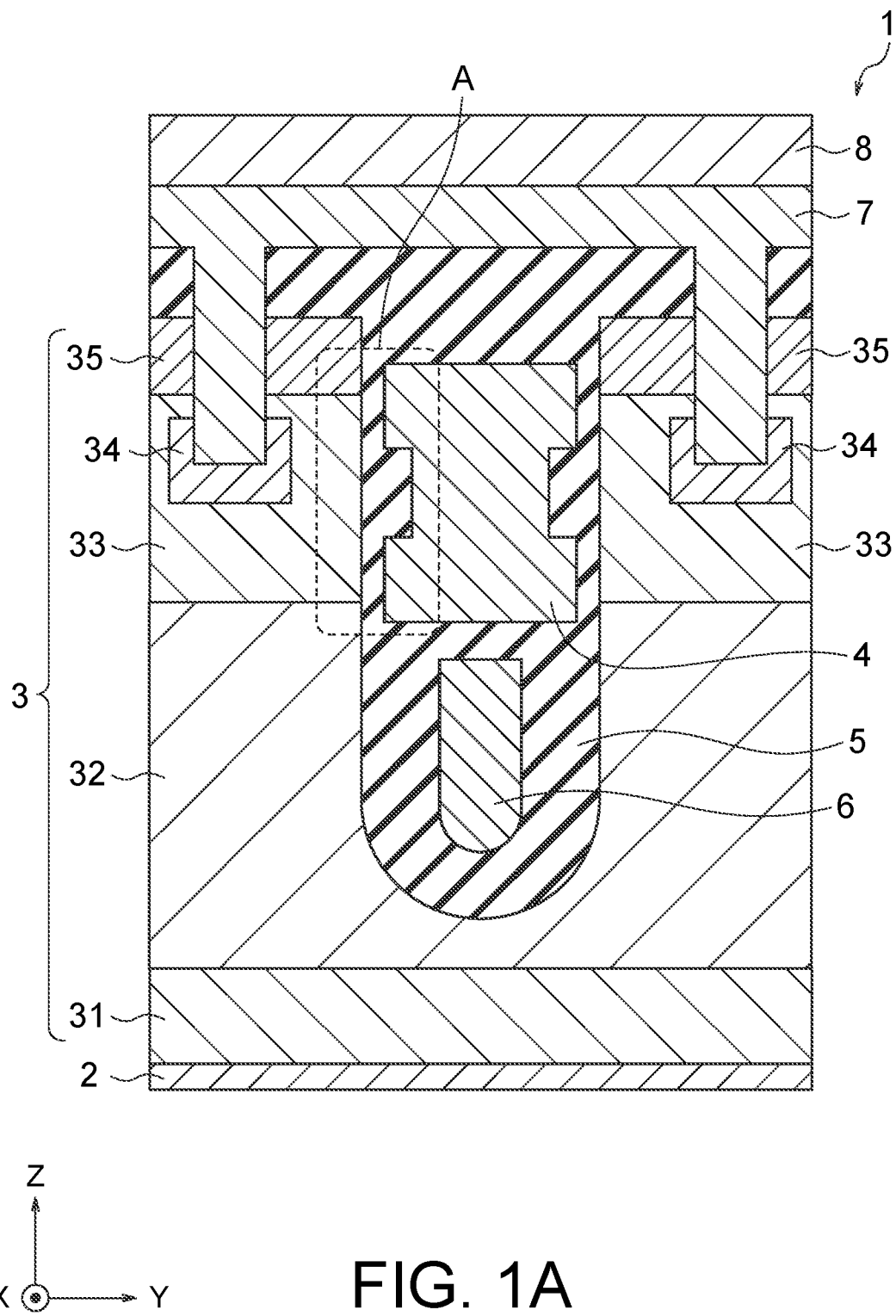
FIG. 1A is a cross-sectional view of a semiconductor device according to a first embodiment.

A semiconductor device according to an embodiment includes a first electrode, a first semiconductor region of a first conductivity type disposed above the first electrode, a second semiconductor region of a second conductivity type disposed on the first semiconductor region, a third semiconductor region of the first conductivity type disposed on the second semiconductor region, an insulating film disposed in the first semiconductor region, the second semiconductor region, and the third semiconductor region, a second electrode disposed in the insulating film so as to be adjacent to the second semiconductor region via the insulating film, and a third electrode electrically connected to the third semiconductor region. The second semiconductor region includes a boundary region that is in contact with the insulating film and faces the second electrode, the boundary region includes a high-concentration region including a peak of an impurity concentration of the second conductivity type, the insulating film includes a first region in contact with the high-concentration region and a second region in contact with a low-concentration region different from the high-concentration region in the boundary region, and a thickness of the second region is smaller than a thickness of the first region.

Embodiments will now be explained with reference to the accompanying drawings. The embodiments do not limit the present invention. The drawings are schematic or conceptual, and a ratio between portions and the like are not necessarily the same as actual ones. In the specification and the drawings, elements similar to those described above regarding the previously described drawings are denoted by the same reference numerals, and detailed description thereof is appropriately omitted.

For convenience of description, an XYZ orthogonal coordinate system is adopted. The Z-axis direction is a laminating direction (thickness direction) of the semiconductor devices. In the Z-axis direction, a source electrode side is also referred to as "upper", and a drain electrode side is also referred to as "lower". However, this expression is for convenience and independent of the direction of gravity.

In the following description, notations of $n^+$, n, $n^-$, and $p^+$, p, and $p^-$ may be used to represent the relative level of impurity concentration in each conductivity type. That is, $n^+$ indicates that a n-type impurity concentration is relatively higher than n, and n' indicates that the n-type impurity concentration is relatively lower than n. In addition, $p^+$ indicates that a p-type impurity concentration is relatively higher than p, and $p^-$ indicates that the p-type impurity concentration is relatively lower than p. The n-type, $n^+$-type, and $n^-$-type are examples of the first conductivity type in the claims. The p-type, $p^+$-type, and $p^-$-type are examples of the second conductivity type in the claims. Note that, in the following description, the n-type and the p-type may be reversed. That is, the first conductivity type may be p-type.

First Embodiment

A semiconductor device 1 according to a first embodiment will be described with reference to FIG. 1A. In the present embodiment, the semiconductor device 1 is configured as a vertical MOSFET having a trench gate structure.

As illustrated in FIG. 1A, the semiconductor device 1 includes a drain electrode 2, a semiconductor region 3, a gate electrode 4, a gate insulating film 5, a field plate electrode (FP electrode) 6, a barrier metal 7, and a source electrode 8.

The drain electrode 2 is an electrode that functions as a drain electrode of the MOSFET. The drain electrode 2 is disposed below the semiconductor region 3. The drain electrode 2 is electrically connected to a drain region 31 included in the semiconductor region 3. The drain electrode 2 is made of a metal such as titanium (Ti), tungsten (W), or aluminum (Al). The drain electrode 2 is an example of a first electrode in the claims.

The semiconductor region 3 is disposed on the drain electrode 2. The semiconductor region 3 includes, for example, the drain region 31, a drift region 32, a base region 33, a contact region 34, and a source region 35.

The semiconductor region 3 may be an epitaxial layer, a semiconductor substrate, or a semiconductor substrate and an epitaxial layer disposed on the semiconductor substrate. In the present embodiment, the semiconductor region 3 is, for example, silicon (Si). In this case, arsenic (As), phosphorus (P), or antimony (Sb), for example, can be used as the n-type impurity. Boron (B), for example, can be used as the p-type impurity. The semiconductor region 3 may be made of a compound semiconductor such as silicon carbide (SiC) or gallium nitride (GaN).

The drain region 31 is a semiconductor region that functions as a drain of the MOSFET. The drain region 31 is disposed on the drain electrode 2 and is electrically connected to the drain electrode 2. The drain region 31 is disposed between the drain electrode 2 and the drift region 32. The drain region 31 is, for example, an $n^+$-type semiconductor region. The drain region 31 is an example of the fourth semiconductor region in the claims.

The drift region 32 is a semiconductor region that functions as a drift region of the MOSFET. The drift region 32 is disposed on the drain region 31 (above the drain electrode 2). The drift region 32 is, for example, an n-type semiconductor region. The drift region 32 is an example of the first semiconductor region in the claims.

The base region 33 is a semiconductor region that functions as a base of the MOSFET. The base region 33 is disposed on the drift region 32 and is adjacent to the gate electrode 4 via the gate insulating film 5. The base region 33 is disposed between the drift region 32 and the source region 35. When a voltage is applied to the gate electrode 4, the base region 33 forms a channel and allows carriers to flow between the drain region 31 and the source region 35. The base region 33 is, for example, a p-type semiconductor region. The base region 33 is an example of the second semiconductor region in the claims.

The contact region 34 is disposed between the base region 33 and the barrier metal 7. The contact region 34 is disposed below the barrier metal 7. The contact region 34 is, for example, a $p^+$-type semiconductor region. The contact region 34 is disposed to prevent generation of a potential difference between the base region 33 and the barrier metal 7 when a reverse voltage is applied to the MOSFET, thereby suppressing element breakdown due to the parasitic transistor.

The source region 35 is a semiconductor region that functions as a source of the MOSFET. The source region 35 is disposed on the base region 33. The source region 35 is disposed in a region between the gate insulating film 5 and the barrier metal 7. The source region 35 is electrically connected to the source electrode 8 via the barrier metal 7. The source region 35 is, for example, an $n^+$-type semiconductor region. The source region 35 is an example of the third semiconductor region in the claims.

The gate electrode 4 is an electrode that functions as a gate electrode of the MOSFET. The gate electrode 4 is disposed in the gate insulating film 5. The gate electrode 4 is disposed so as to be adjacent to (face) the base region 33 via the gate insulating film 5 in the Y-axis direction. In the present embodiment, as shown in FIG. 1A, the gate electrode 4 has an H-shaped cross section with a small central thickness (width in the Y-axis direction). The gate electrode 4 is made of, for example, polysilicon. The gate electrode 4 is an example of the second electrode in the claims.

The gate insulating film 5 is disposed in the drift region 32, the base region 33, and the source region 35, and electrically insulates the gate electrode 4 from the semiconductor region 3 and the barrier metal 7. The gate insulating film 5 electrically insulates the FP electrode 6 from the semiconductor region 3. In the present embodiment, the gate insulating film 5 is an insulating film embedded in a gate trench provided from the source region 35 to the middle of the drift region 32. The gate insulating film 5 is made of an insulating material such as silicon oxide or silicon nitride. The gate insulating film 5 is an example of the insulating film in the claims.

The FP electrode 6 is disposed below the gate electrode 4 in the gate insulating film 5. The FP electrode 6 is electrically connected to source electrode 8. The FP electrode 6 is disposed to reduce concentration of the reverse electric field between the gate electrode 4 and the drain electrode 2 to increase the withstand voltage. The FP electrode 6 is made of, for example, polysilicon. The FP electrode 6 is an example of the fourth electrode in the claims.

The barrier metal 7 is used for preventing a reaction between the metal material used for the source electrode 8 and the semiconductor material used for the semiconductor region 3. The barrier metal 7 is in contact with the base region 33, the contact region 34, and the source region 35. The barrier metal 7 contains, for example, titanium, titanium nitride (TiN), tantalum (Ta), tantalum nitride (TaN), or the like.

The source electrode 8 is an electrode that functions as a source electrode of the MOSFET. The source electrode 8 is electrically connected to the barrier metal 7 and is electrically connected to the source region 35. The source electrode 8 is made of, for example, copper, aluminum, or the like. The source electrode 8 is an example of the third electrode in the claims.

In the above description, the semiconductor device 1 is a vertical MOSFET; however, the semiconductor device 1 may be configured as an insulated gate bipolar transistor (IGBT) having a similar structure, that is, a trench gate structure. When the semiconductor device 1 is an IGBT, the drain region 31 may be changed to, for example, a p$^+$-type collector region, or a collector region may be additionally disposed between the drain region 31 and the drain electrode 2. The other configurations are the same as those of the vertical MOSFET described in the present embodiment. Note that, when the semiconductor device 1 is an IGBT, the source region 35 is an emitter region. The collector region is an example of the fifth semiconductor region in the claims.

<Shape of Gate Insulating Film 5>

Figure 1B:
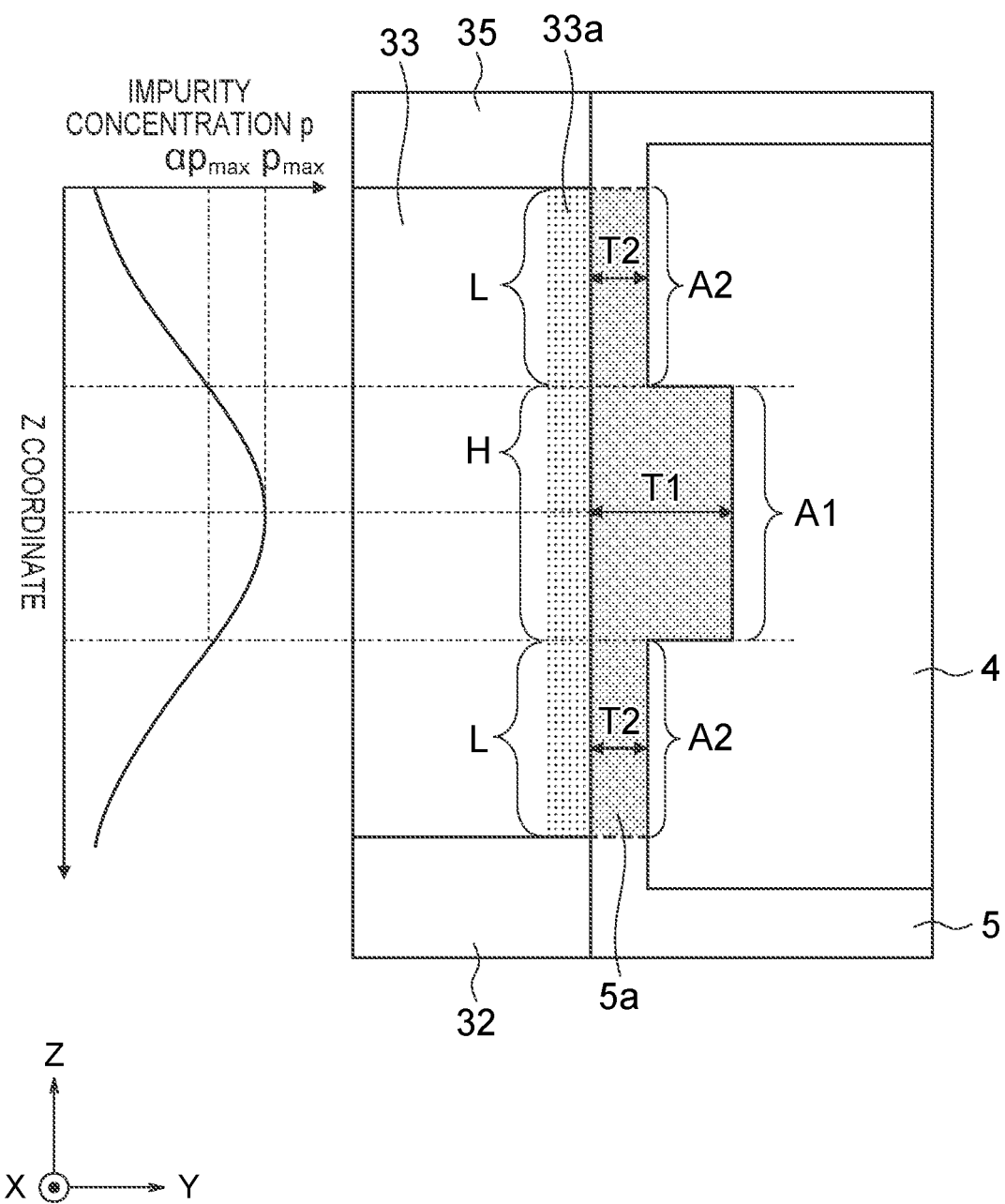
FIG. 1B is a view illustrating the shape of a gate insulating film included in the semiconductor device according to the first embodiment.

Here, the shape of the gate insulating film 5 will be described with reference to FIG. 1B. FIG. 1B is a view for explaining a relationship between the thickness of a portion 5a of the gate insulating film 5 sandwiched between the base region 33 and the gate electrode 4 and the impurity concentration of a boundary region 33a. Here, the thickness of the portion 5a refers to the width of the portion 5a in the Y-axis direction, and corresponds to the distance between the base region 33 and the gate electrode 4 in the Y-axis direction. The right drawing of FIG. 1B is an enlarged view of a region A shown in FIG. 1A.

As illustrated in FIG. 1B, the base region 33 includes the boundary region 33a that is in contact with the gate insulating film 5 (the portion 5a) and faces the gate electrode 4. The graph (the left drawing) illustrated in FIG. 1B shows concentration distribution of impurity concentration p in the boundary region 33a.

As illustrated in FIG. 1B, the impurity concentration p in the boundary region 33a is not uniform, but is biased in the Z-axis direction. The maximum value of the impurity concentration p is defined as a peak $p_{max}$. The boundary region 33a includes a region having a relatively high impurity concentration p (high-concentration region H) including the peak $p_{max}$, and a low-concentration region L other than the high-concentration region H. The high-concentration region H is a region in the boundary region 33a where the impurity concentration p is equal to or higher than a predetermined ratio α of the peak $p_{max}$ (that is, the impurity concentration p is α$p_{max}$ to $p_{max}$).

As illustrated in FIG. 1B, the thickness of the portion 5a changes according to the impurity concentration p of the boundary region 33a. The gate insulating film 5 (the portion 5a) includes a region A1 in contact with the high-concentration region H and a region A2 that is a region (other than the region A1) in contact with the low-concentration region L. In the present embodiment, the region A2 is the entire region excluding the region A1 from the portion 5a.

A thickness T2 of the region A2 is smaller than a thickness T1 of the region A1. In the present embodiment, the shape (thickness) of the portion 5a as described above is achieved by the gate electrode 4 having the H-shaped cross section.

In FIG. 1B, because the high-concentration region H is located near the center of the boundary region 33a, the region A2 is located above and below the region A1. However, the high-concentration region H may include the upper end or the lower end of the boundary region 33a. That is, the high-concentration region H may be in contact with the drift region 32 or the source region 35. In this case, the region A2 is located on one of the upper side and the lower side of the region A1.

<Simulation Results>

An effect obtained by changing the thickness of the portion 5a of the insulating film 5 according to the impurity concentration p of the boundary region 33a as described above will be described with reference to FIG. 1C.

Figure 1C:
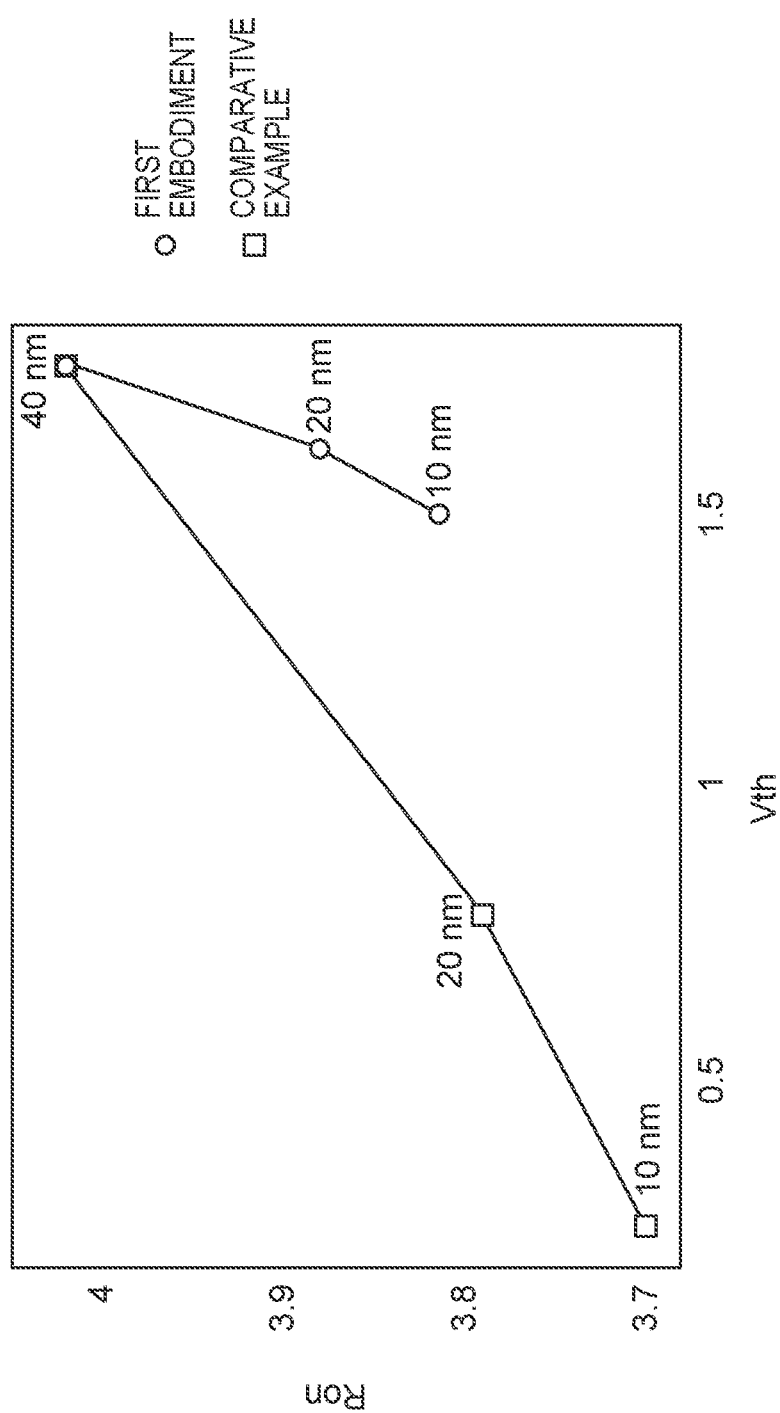
FIG. 1C is a diagram illustrating an example of a relationship between a threshold voltage and an on-resistance of the semiconductor device according to the first embodiment.

FIG. 1C is a graph illustrating an example of a relationship between a threshold voltage Vth and an on-resistance Ron of the semiconductor device 1 according to the present embodiment when the thickness T2 is changed, the relationship being obtained by simulation. In the simulation of the present embodiment, the predetermined ratio α=0.5, and the thickness T1 is always 40 nm.

FIG. 1C also illustrates a relationship between the threshold voltage Vth and the on-resistance Ron of a semiconductor device according to a comparative example obtained by simulation. In the comparative example, the thickness of the gate insulating film 5 in a portion in contact with the boundary region 33a is constant (that is, T1=T2). The numerical values in the vicinity of each plot indicate the magnitude of the thickness T2 in each plot.

As can be seen from the comparative example illustrated in FIG. 1C, when the thickness of the portion 5a is uniformly reduced (that is, when T1 and T2 are reduced together) in order to reduce the on-resistance Ron (channel resistance), the threshold voltage Vth also decreases. That is, the on-resistance Ron and the threshold voltage Vth are in a trade-off relationship.

On the other hand, in the present embodiment, the thickness T2 of the region A2 in contact with the low-concentration region L having a small influence on the threshold voltage Vth is made smaller than the thickness T1 of the region A1 in contact with the high-concentration region H. As a result, the channel resistance can be lowered while suppressing the decrease of the threshold voltage Vth, and thus the on-resistance Ron can be lowered. That is, the trade-off relationship between the on-resistance Ron and the threshold voltage Vth can be improved.

In the above simulation, the predetermined ratio α is 0.5, but the effective value of α depends on impurity concentration profile in the boundary region 33a of the base region 33, the film thickness of the portion 5a of the gate insulating film 5, and the like. For example, the predetermined ratio α may be 0.7 or more and 0.95 or less.

Furthermore, in the present embodiment, since the thickness of the portion 5a of the gate insulating film 5 is only changed and the base length is not changed, the short channel effect can be prevented.

As described above, according to the present embodiment, since the thickness of the region A1 in contact with the high-concentration region H is larger than the thickness of the region A2 in contact with the low-concentration region L, it is possible to provide a semiconductor device capable of reducing the on-resistance while maintaining the channel length and suppressing the reduction in the threshold voltage.

In the description of the first embodiment, the region A2 is a region other than the region A1 in the portion 5a of the insulating film 5. That is, as illustrated in FIG. 1B, when the high-concentration region H is not in contact with the drift region 32 and the source region 35, the region A2 is located above and below the region A1. However, when the trade-off relationship between the on-resistance Ron and the threshold voltage Vth only needs to be improved to some extent, the region A2 may not necessarily be all the regions other than the region A1 in the boundary region 33a. That is, the region A2 may be in contact with any one of the low-concentration regions L located above and below the high-concentration region H. In that case, some steps can be omitted in a method of manufacturing the semiconductor device 1 described later.

From the above viewpoint, two modifications (a first modification and a second modification) according to the first embodiment will be described below.

First Modification

Figure 2A:
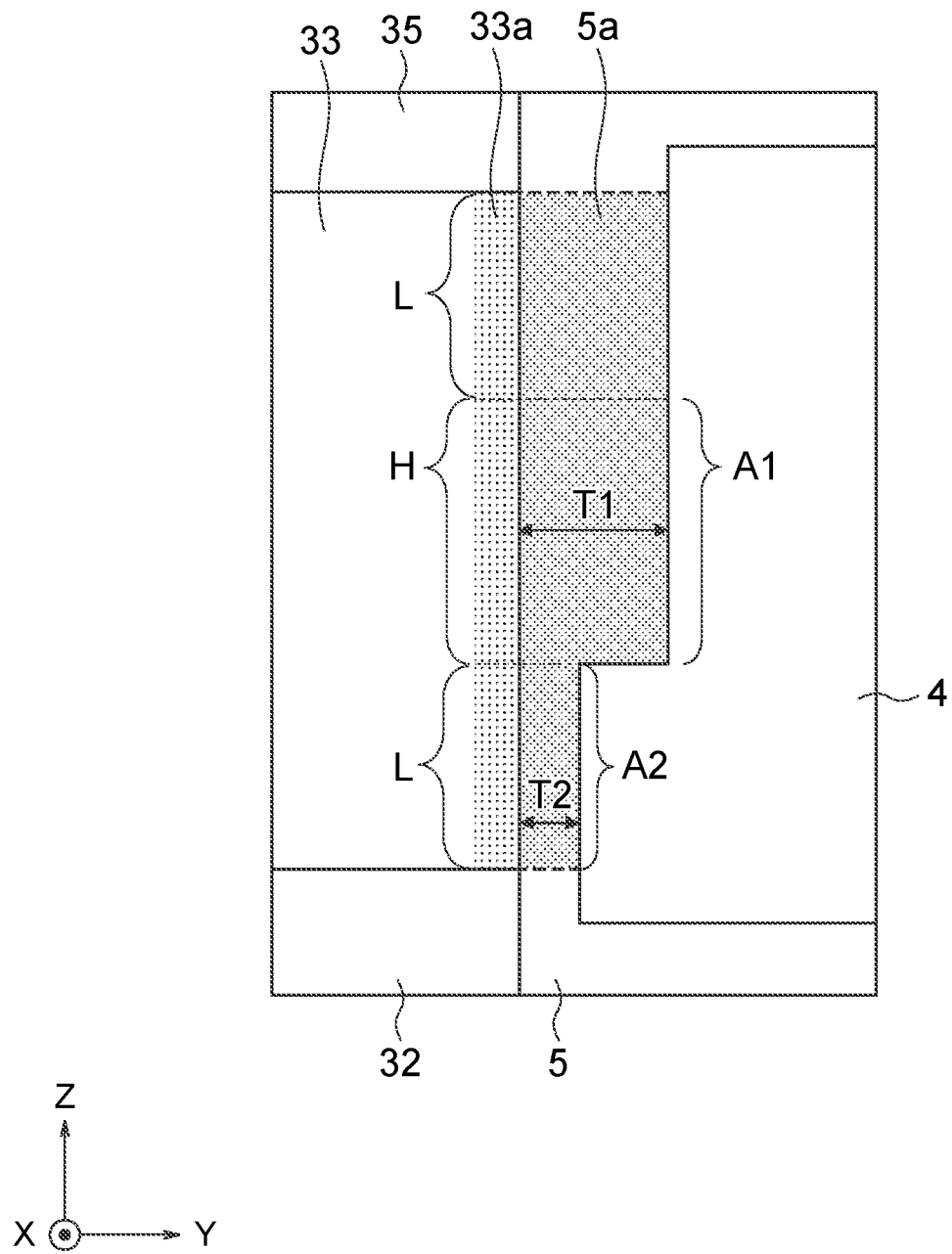
FIG. 2A is a view illustrating the shape of a gate insulating film included in a semiconductor device according to a first modification of the first embodiment.

FIG. 2A is an enlarged view of a region A of a semiconductor device 1 according to a first modification of the first embodiment. There is no change in portions other than the region A. In the first modification, as illustrated in FIG. 2A, a region A2 is located below a region A1, and a region above the region A1 has the same thickness (thickness T1) as the region A1.

<Simulation Results>

Figure 2B:
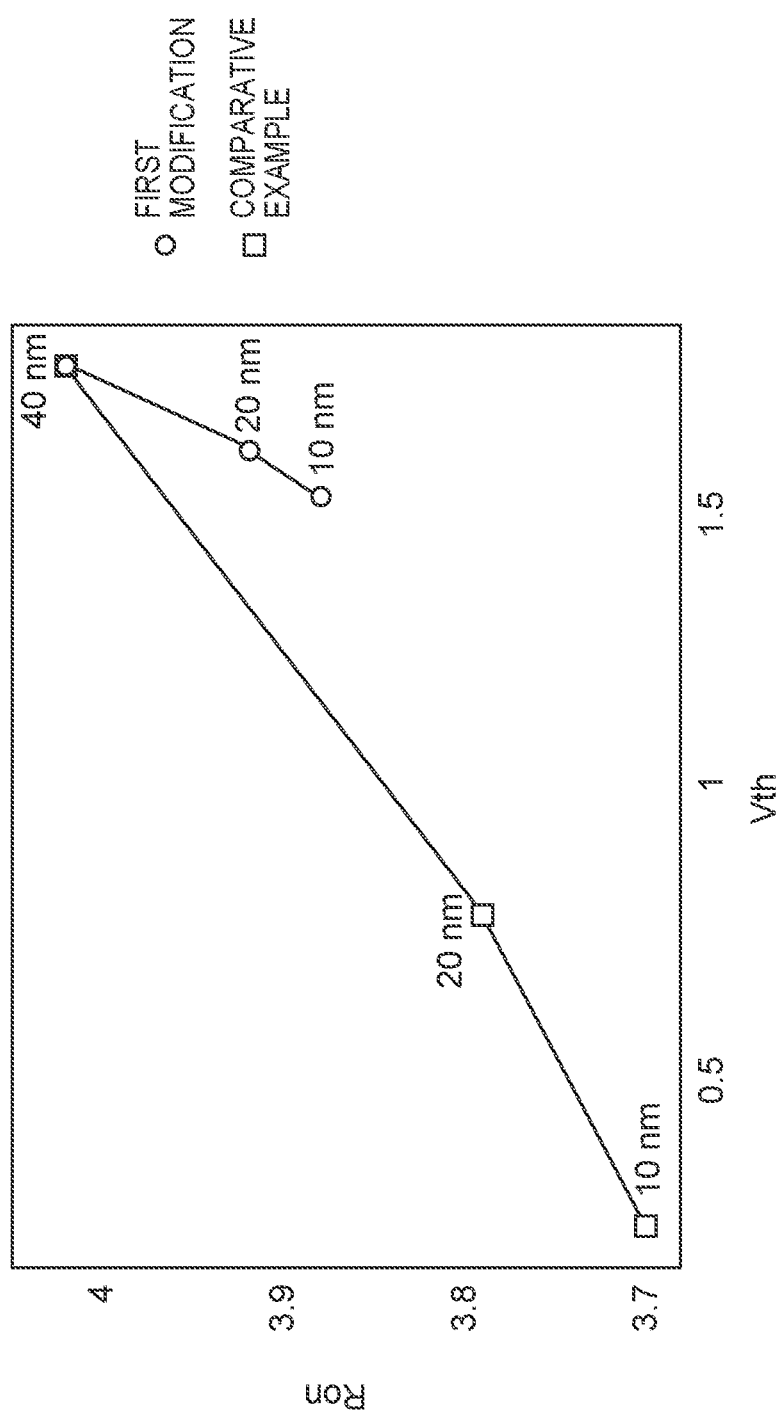
FIG. 2B is a diagram illustrating an example of a relationship between a threshold voltage and an on-resistance of the semiconductor device according to the first modification of the first embodiment.

Effects brought about by the shape of a portion 5a of the semiconductor device 1 according to the first modification will be described with reference to FIG. 2B. FIG. 2B is a graph illustrating an example of a relationship between the threshold voltage Vth and the on-resistance Ron of the semiconductor device 1 according to the first modification when the thickness T2 is changed, the relationship being obtained by simulation. A comparative example illustrated in FIG. 2B is the same as the comparative example illustrated in FIG. 1C. Also in the simulation of the present modification, the predetermined ratio α=0.5, and T1 is always 40 nm.

As can be seen from FIG. 2B, although the reduction of the on-resistance as in the first embodiment cannot be obtained, the trade-off relationship between the on-resistance Ron and the threshold voltage Vth can be improved also in the present modification.

Second Modification

Figure 3A:
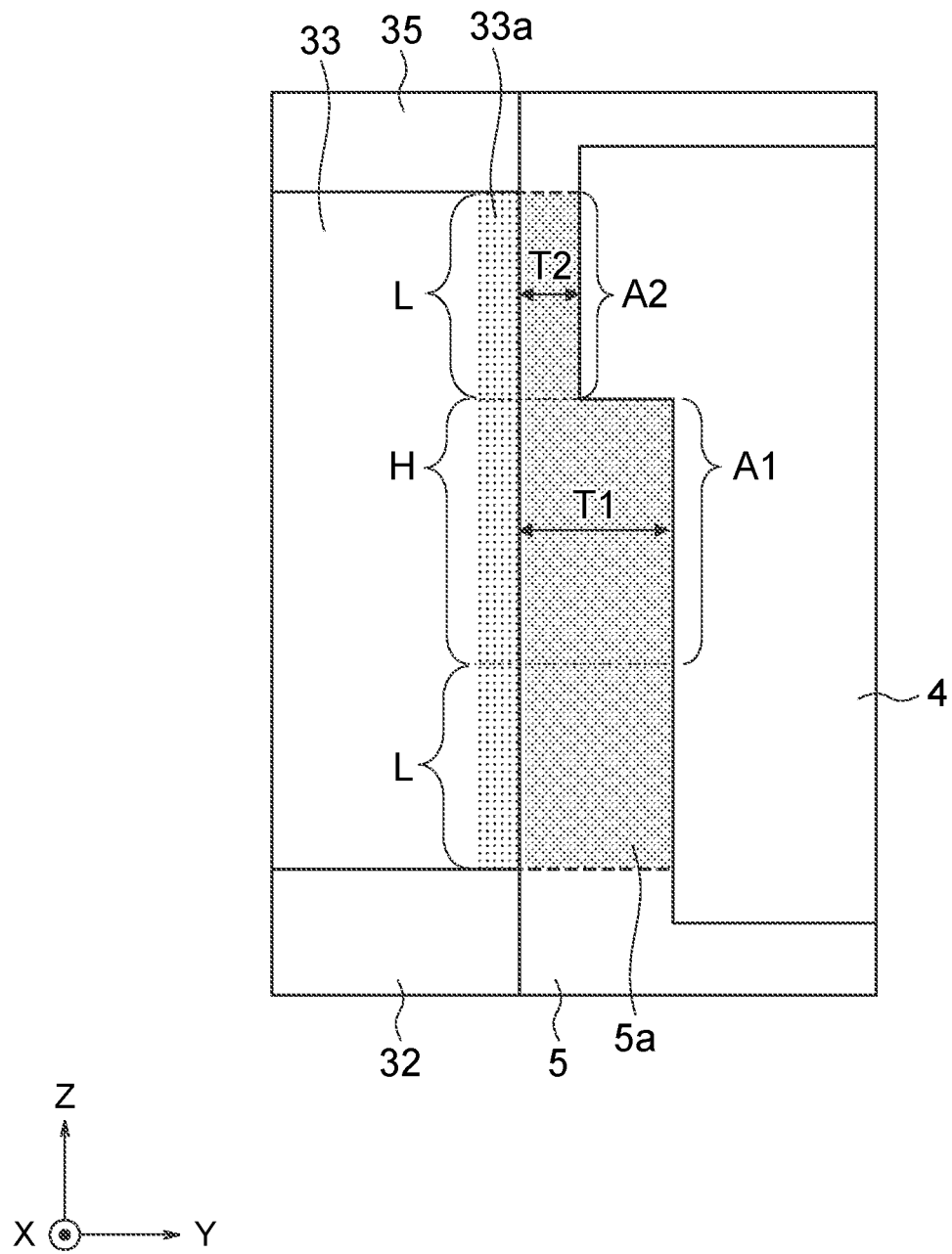
FIG. 3A is a view illustrating the shape of a gate insulating film included in a semiconductor device according to a second modification of the first embodiment.

FIG. 3A is an enlarged view of a region A of a semiconductor device 1 according to a second modification of the first embodiment. There is no change in portions other than the region A. In the second modification, as shown in FIG. 3A, a region A2 is located above a region A1, and a region below region A1 has the same thickness (thickness T1) as the region A1.

<Simulation Results>

Figure 3B:
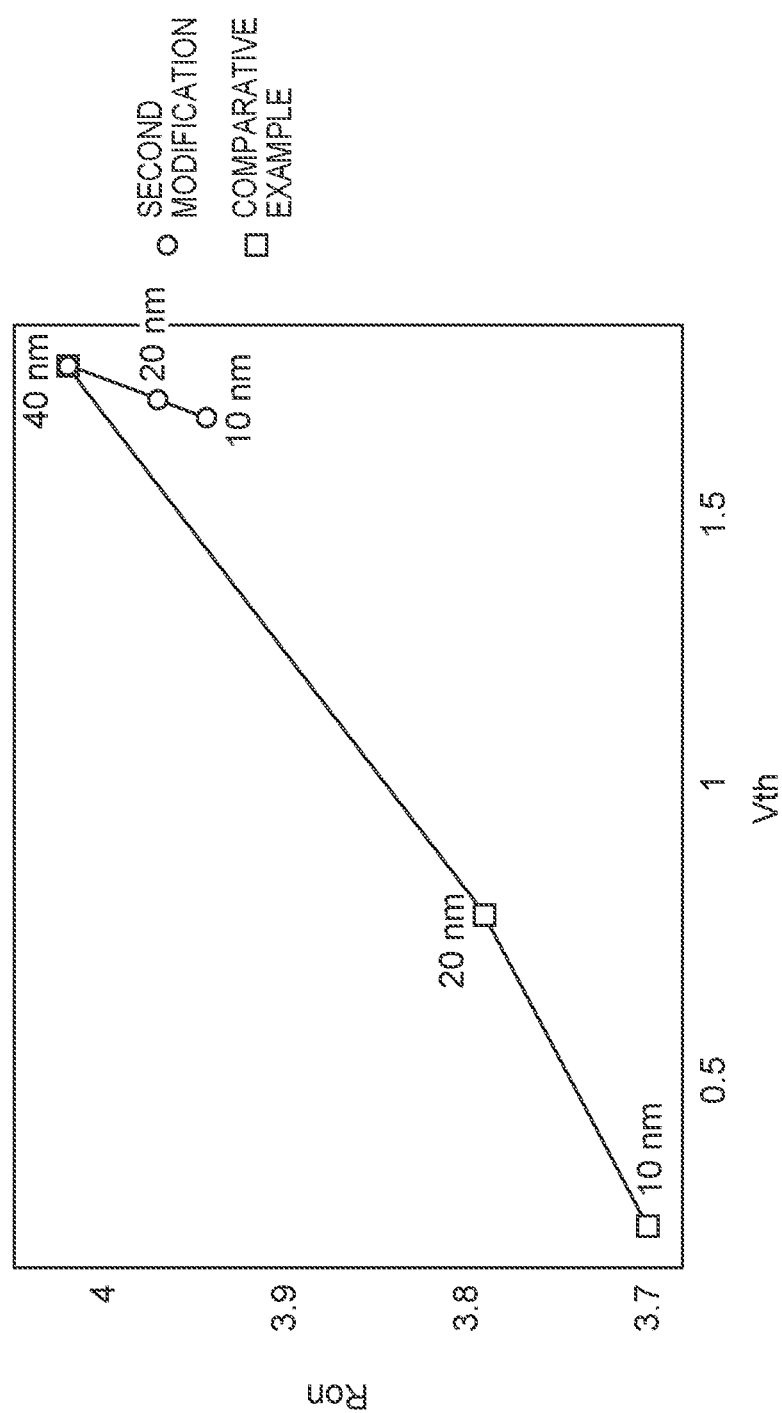
FIG. 3B is a diagram illustrating an example of a relationship between a threshold voltage and an on-resistance of a semiconductor device according to the second modification of the first embodiment.

Effects brought about by the shape of the portion 5a of the semiconductor device 1 according to the second modification will be described with reference to FIG. 3B. FIG. 3B is a graph illustrating an example of a relationship between the threshold voltage Vth and the on-resistance Ron of the semiconductor device 1 according to the second modification when the thickness T2 is changed, the relationship being obtained by simulation. A comparative example illustrated in FIG. 3B is the same as the comparative example illustrated in FIG. 1C. Also in the simulation of the present modification, the predetermined ratio α=0.5, and T1 is always 40 nm.

As can be seen from FIG. 3B, although the reduction of the on-resistance as in the first embodiment cannot be obtained, the trade-off relationship between the on-resistance Ron and the threshold voltage Vth can also be improved in the present modification.

As described in the first embodiment, the first modification, and the second modification, in order to improve the trade-off relationship between the on-resistance Ron and the threshold voltage Vth, the region A2 may be a region different from the region A1 in the portion 5a. That is, in the example illustrated in FIGS. 2A and 2B, the region A2 may be at least one of the upper and lower regions of the region A1.

Third Modification

Figure 4:
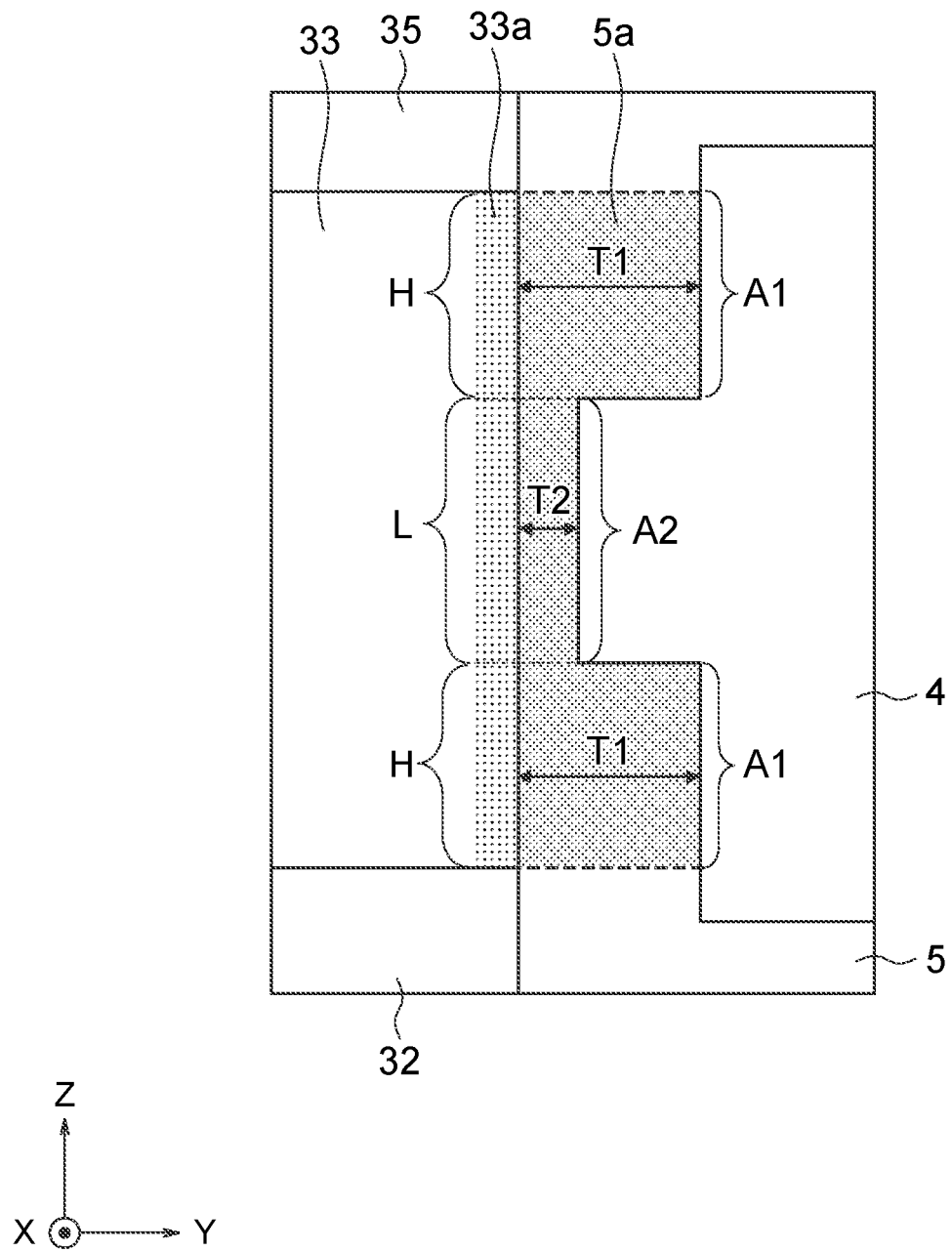
FIG. 4 is a view illustrating the shape of a gate insulating film included in a semiconductor device according to a third modification of the first embodiment.

In the above description, there is one high-concentration region H, but there may be a plurality of high-concentration regions H depending on the distribution of the impurity concentration p in the boundary region 33a. FIG. 4 is an enlarged view of a region A of a semiconductor device 1 according to a third modification of the first embodiment. There is no change in portions other than the region A. As illustrated in FIG. 4, in the present modification, a high-concentration region H is positioned to be separated in the Z-axis direction. In such a case, a region A1 is also positioned to be separated in the Z-axis direction in accordance with the high-concentration region H.

As in the present modification, even in a case where there is a plurality of high-concentration regions H, it is possible to improve the trade-off relationship between the on-resistance Ron and the threshold voltage Vth by arranging the region A1 and A2 having different thicknesses corresponding to the high-concentration regions H.

Fourth Modification

Figure 5:
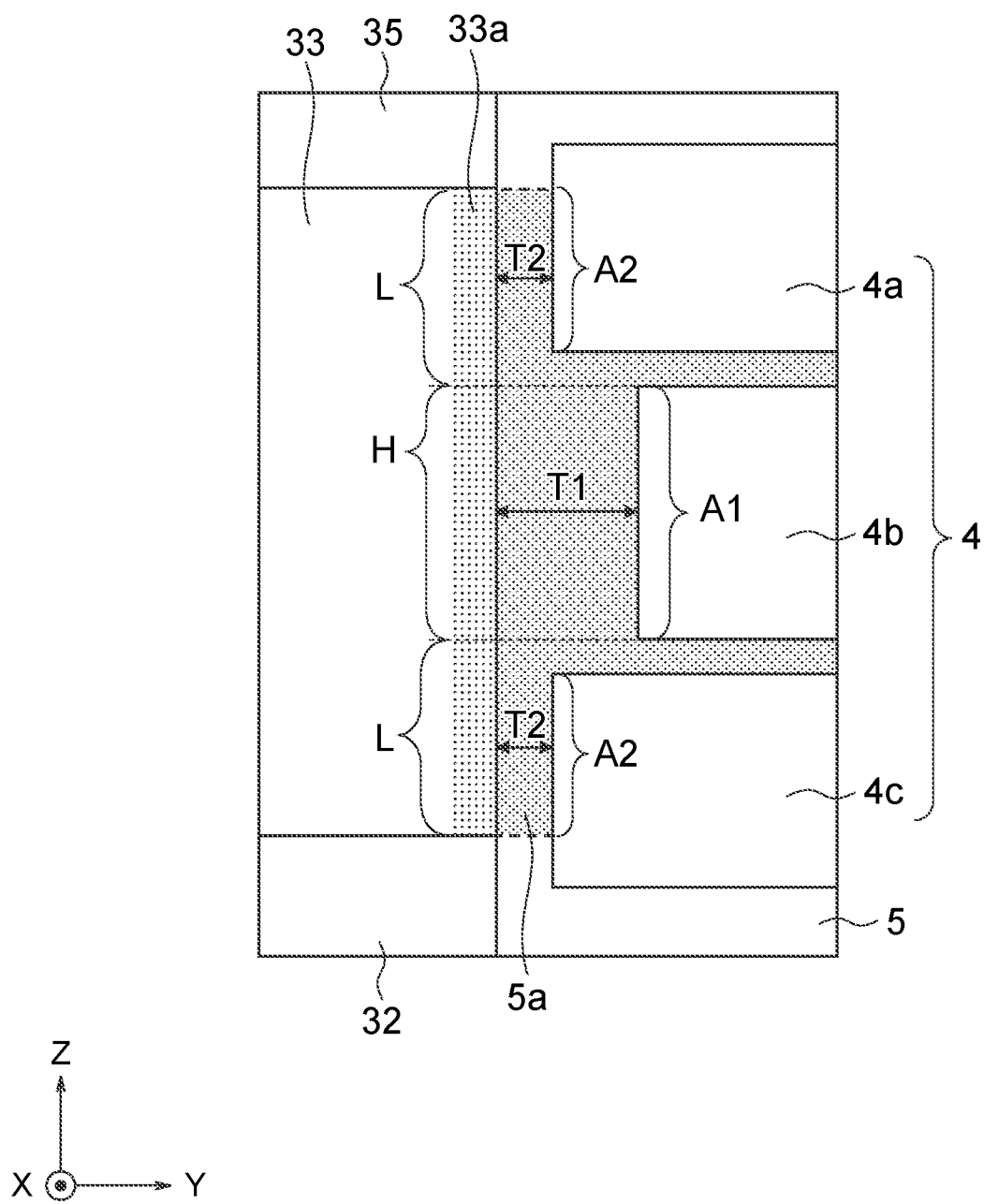
FIG. 5 is a view illustrating the shape of a gate insulating film included in a semiconductor device according to a fourth modification of the first embodiment.

FIG. 5 is an enlarged view of a region A of a semiconductor device 1 according to a fourth modification of the first embodiment. There is no change in portions other than the region A. As illustrated in FIG. 5, in the present modification, the gate electrode 4 includes partial electrodes 4a, 4b, and 4c disposed apart from each other. The partial electrodes 4a, 4b, and 4c are electrically connected to each other by a metal plug (not shown) passing through the partial electrodes 4a, 4b, and 4c in the Z-axis direction, and are equipotential. The metal plug is disposed in a gate contact portion locally provided along the X-axis direction. The partial electrode 4b is adjacent to the high-concentration region H via a region A1. The partial electrodes 4a and 4c are adjacent to low-concentration regions L via a region A2. The partial electrodes 4a and 4b are examples of the first partial electrode and the second partial electrode in the claims, respectively.

Also in the present modification, the region A1 and the region A2 having different thicknesses are arranged corresponding to the high-concentration region H and the low-concentration region L, so that the trade-off relationship between the on-resistance Ron and the threshold voltage Vth can be improved.

<Method of Manufacturing Semiconductor Device>

Next, an example of a method of manufacturing the semiconductor device 1 will be described with reference to FIGS. 6A to 6H. FIGS. 6A to 6H are process cross-sectional views for explaining the method of manufacturing the semiconductor device 1. Here, steps of manufacturing the gate insulating film 5 will be mainly described, and other steps will be omitted or simplified as appropriate.

Figure 6A:
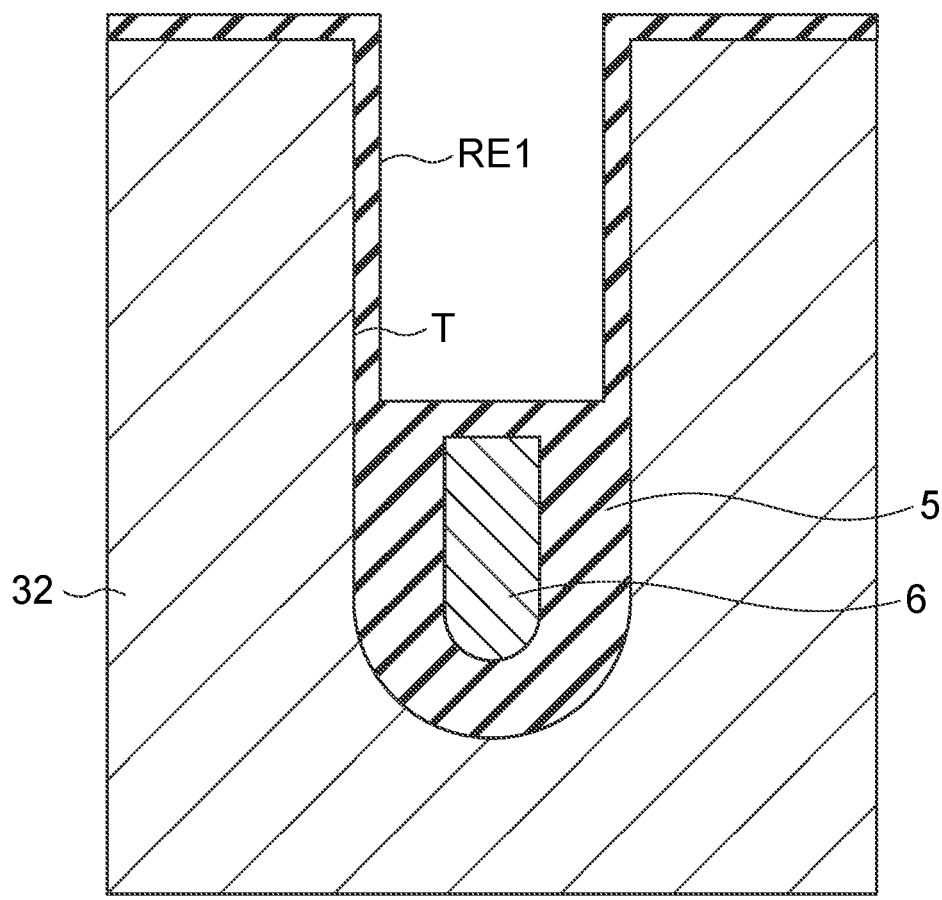
FIG. 6A is a cross-sectional view for explaining an example of a step of the method of manufacturing the semiconductor device according to the first embodiment.

First, as illustrated in FIG. 6A, a trench T is provided in the drift region 32 formed in a semiconductor wafer, and the gate insulating film 5 is disposed in the trench T. The trench T is partially filled with the gate insulating film 5, and a recess RE1 is formed. The gate insulating film 5 is made of, for example, silicon oxide. In the present embodiment, the FP electrode 6 is buried in the gate insulating film 5, but the FP electrode 6 may not be provided.

Figure 6B:
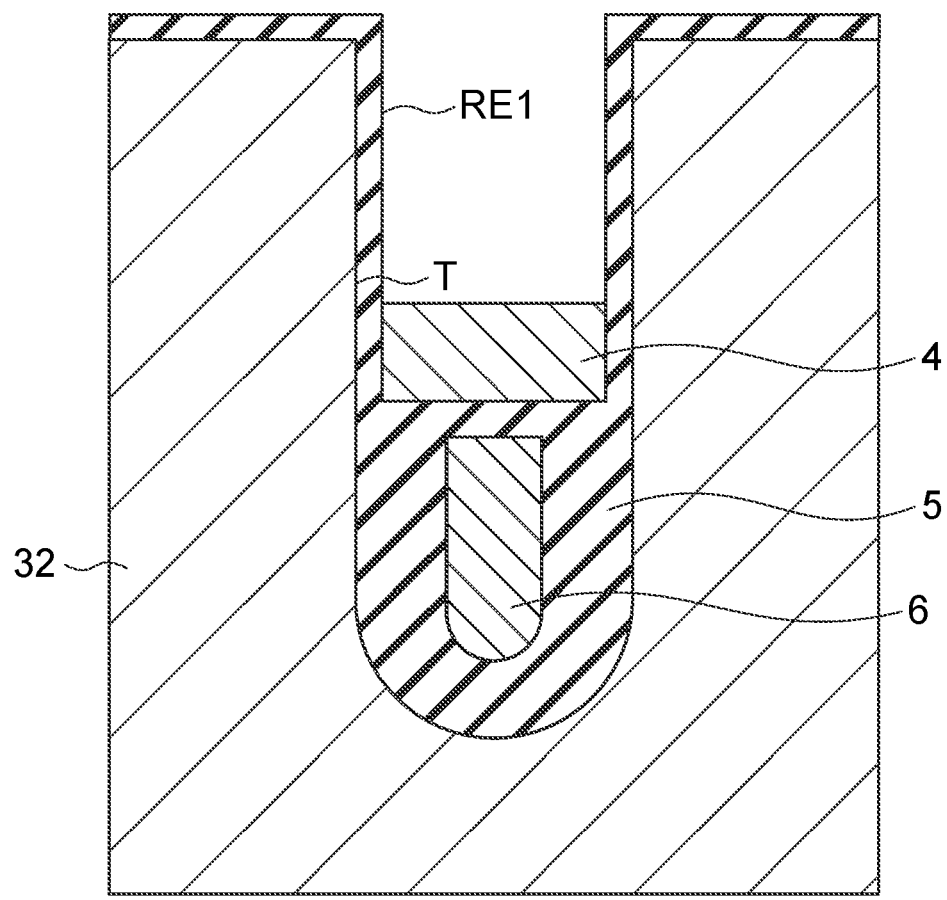
FIG. 6B is a cross-sectional view for explaining an example of a step of the method of manufacturing the semiconductor device according to the first embodiment, following FIG. 6A.

Next, as illustrated in FIG. 6B, the gate electrode 4 is formed in the recess RE1. The gate electrode 4 is formed by, for example, depositing a conductive material such as polysilicon so as to fill the recess RE1, and then etching back the excessive conductive material.

Figure 6C:
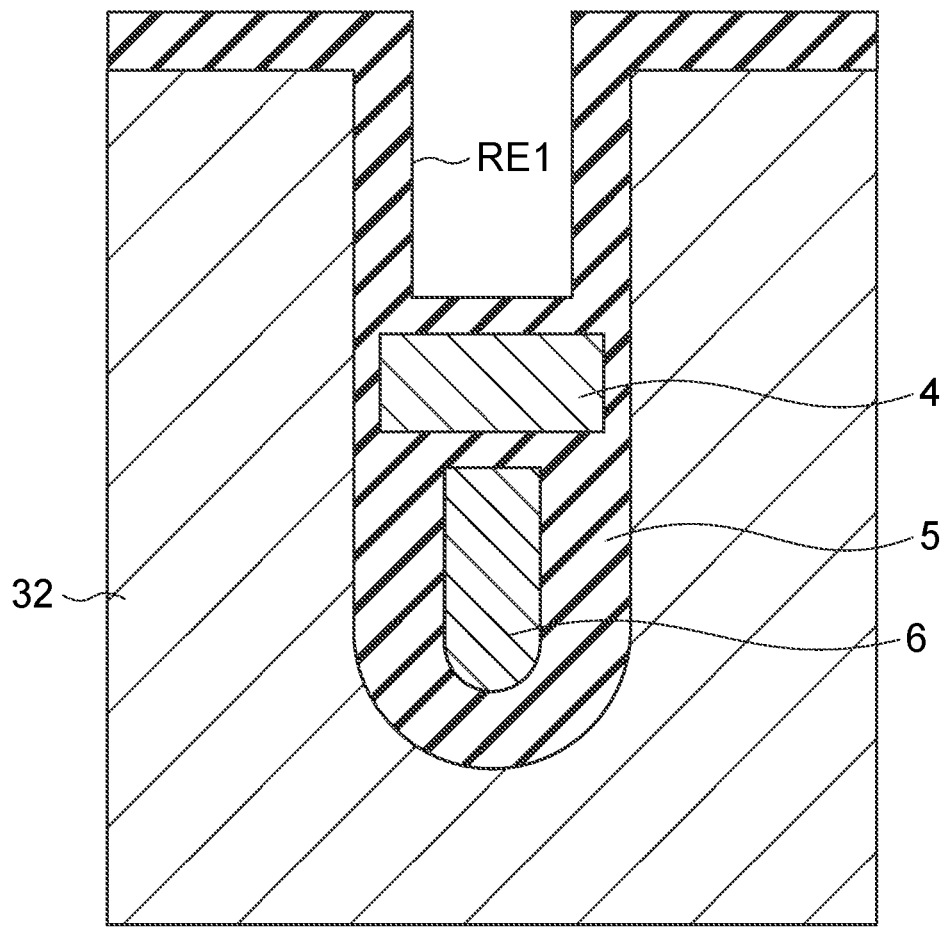
FIG. 6C is a cross-sectional view for explaining an example of a step of the method of manufacturing the semiconductor device according to the first embodiment, following FIG. 6B.

Next, as illustrated in FIG. 6C, an insulating material is deposited in the recess RE1 by physical vapor deposition (PVD), chemical vapor deposition (CVD), or the like. As a result, the gate electrode 4 is buried in the gate insulating film 5. In addition, the width of the recess RE1 decreases. The insulating material is, for example, silicon oxide.

Figure 6D:
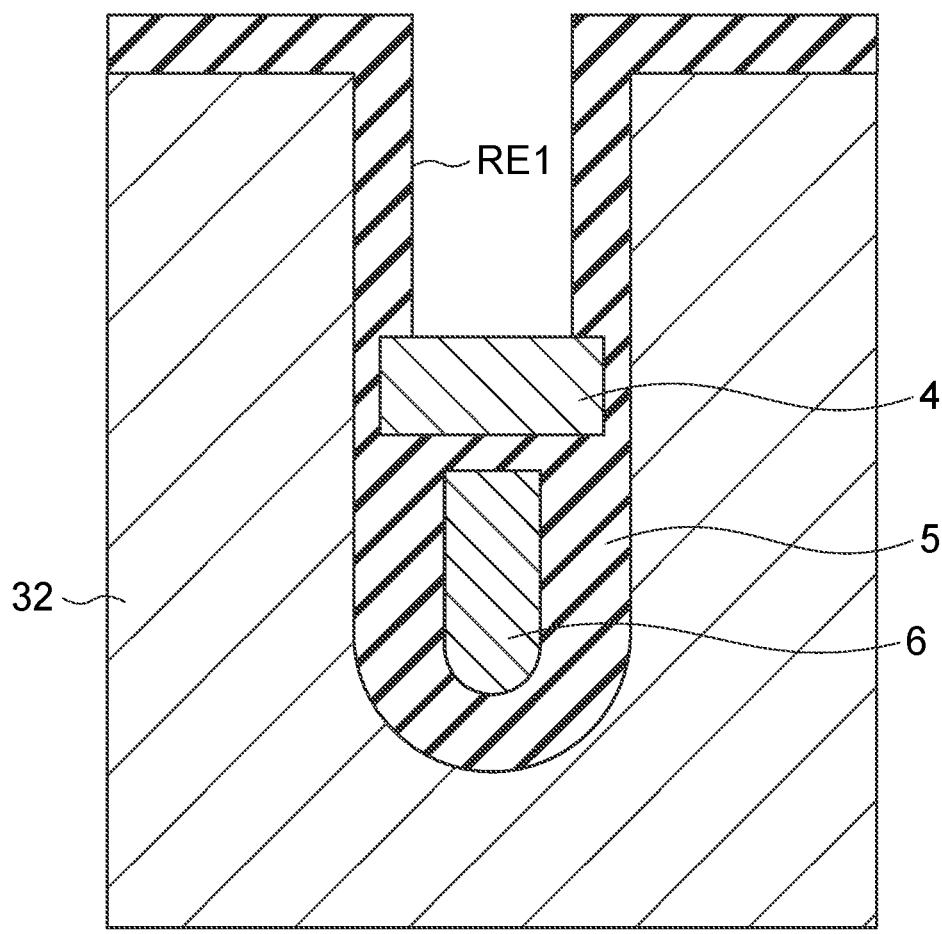
FIG. 6D is a cross-sectional view for explaining an example of a step of the method of manufacturing the semiconductor device according to the first embodiment, following FIG. 6C.

Next, as illustrated in FIG. 6D, a part of the gate insulating film 5 is removed by a combination of, for example, a resist mask and reactive ion etching (RIE) so that the gate electrode 4 is exposed on the bottom surface of the recess RE1. At this time, the width of the recess RE1 is substantially the same as the width in the preceding step.

Figure 6E:
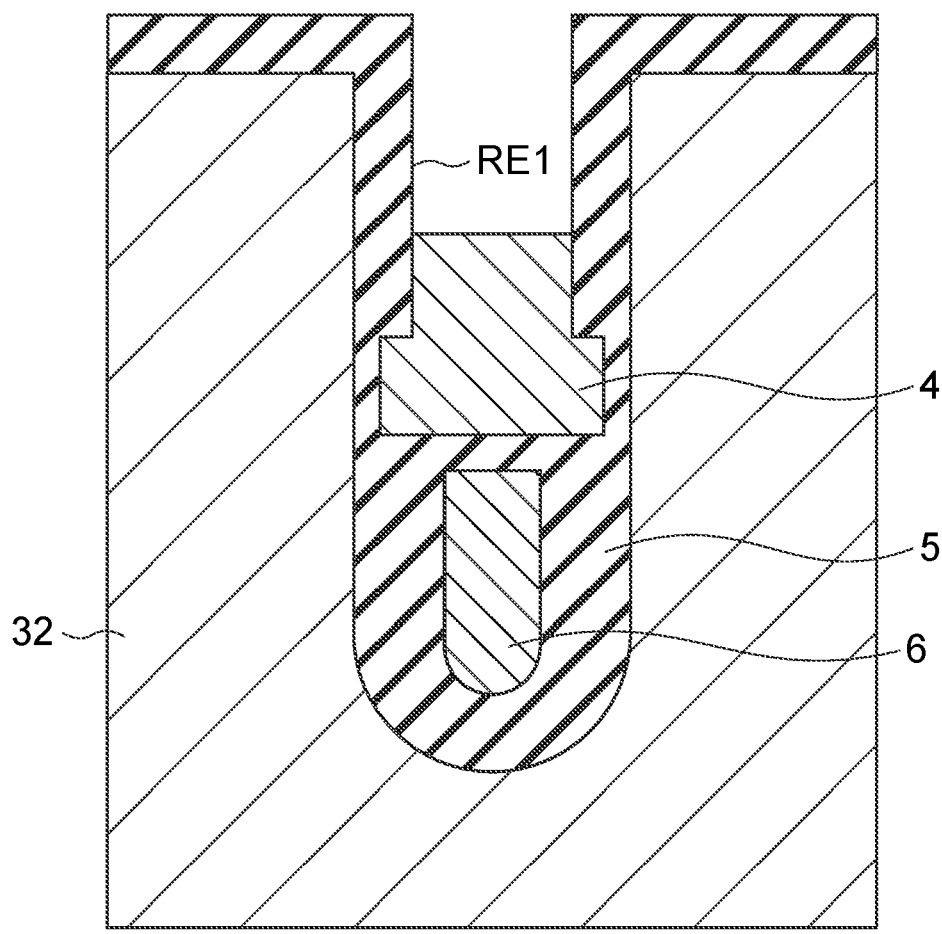
FIG. 6E is a cross-sectional view for explaining an example of a step of the method of manufacturing the semiconductor device according to the first embodiment, following FIG. 6D.

Next, as illustrated in FIG. 6E, for example, after the conductive material is laminated so as to fill the recess RE1, the gate electrode 4 is extended upward by etching back the excess conductive material.

Figure 6F:
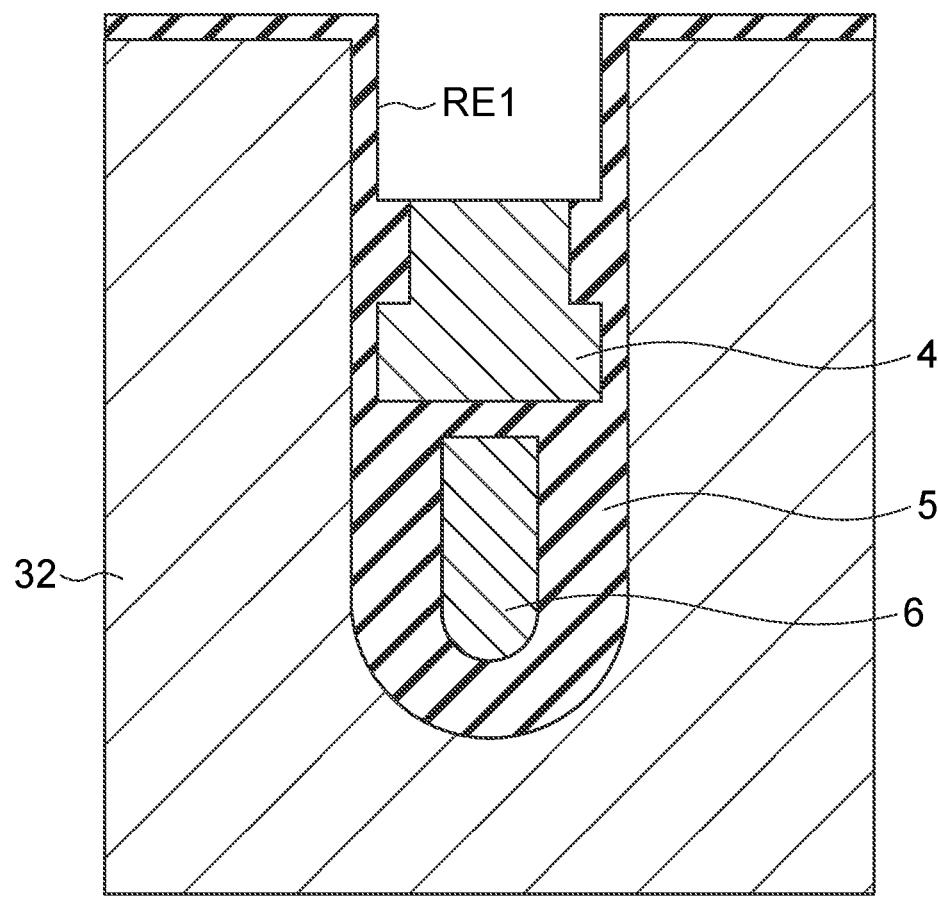
FIG. 6F is a cross-sectional view for explaining an example of a step of the method of manufacturing the semiconductor device according to the first embodiment, following FIG. 6E.

Next, as illustrated in FIG. 6F, a part of the gate insulating film 5 is removed by, for example, wet etching to widen the width of the recess RE1 above the gate electrode 4.

Figure 6G:
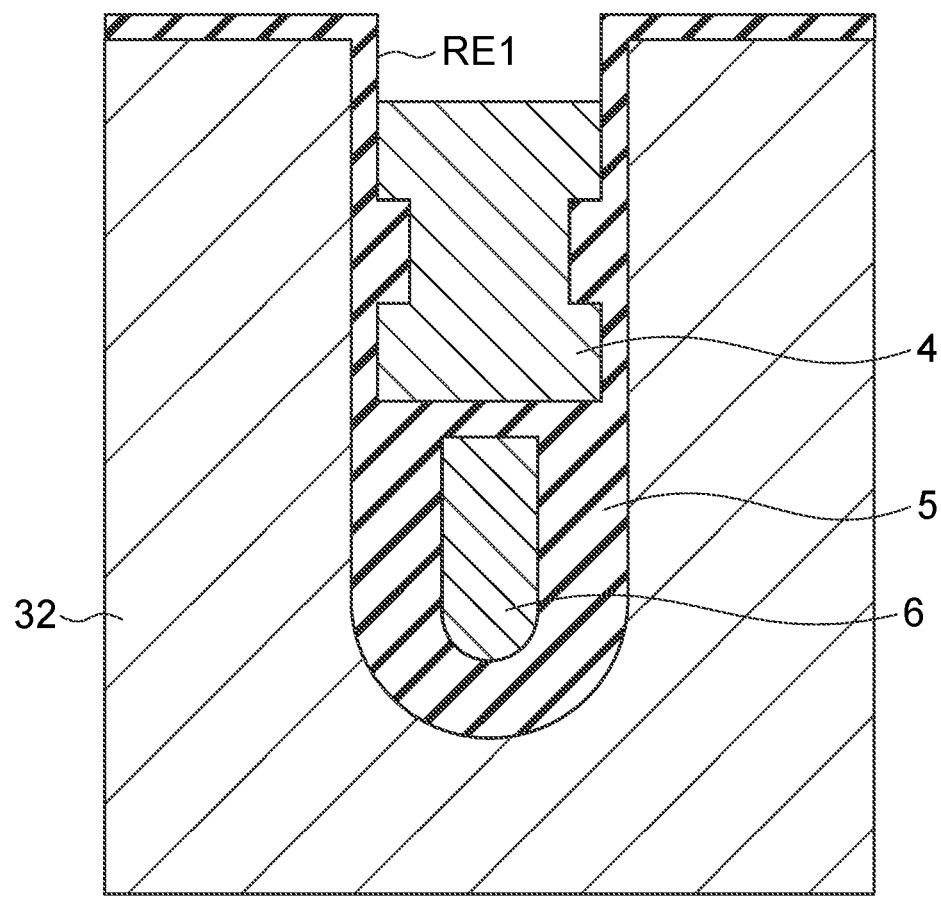
FIG. 6G is a cross-sectional view for explaining an example of a step of the method of manufacturing the semiconductor device according to the first embodiment, following FIG. 6F.

Next, as illustrated in FIG. 6G, for example, after the conductive material is laminated so as to fill the recess RE1, the gate electrode 4 is extended upward by etching back the excess conductive material. Thus, the gate electrode 4 having an H-shaped cross section is formed. The shape of the portion 5a of the gate insulating film 5 is also determined by determining the shape of the gate electrode 4.

Thereafter, although not illustrated, impurity ions of the second conductivity type and the first conductivity type are ion-implanted into the drift region 32 to form the base region 33 and the source region 35. The base region 33 is formed using a technique such as ion implantation such that a region adjacent to a portion of the portion 5a of the insulating film 5 having the thickness T1 becomes the high-concentration region H in the boundary region 33a. Thereafter, an insulating material is deposited in the recess RE1 by a method such as PVD or CVD, and the gate electrode 4 is buried in the gate insulating film 5.

Thereafter, although not illustrated, a contact trench in which the base region 33 and the source region 35 are exposed is provided on the inner wall. Then, ions of the second conductivity type are ion-implanted into the bottom of the contact trench to form the contact region 34. Thereafter, the barrier metal 7 is formed by depositing a first metal material so as to fill the contact trench. The first metal material includes, for example, titanium, tungsten, nickel, or the like. Thereafter, a second metal material is deposited on the barrier metal 7 to form the source electrode 8. The second metal material includes, for example, copper, aluminum, or the like. In addition, ion implantation is performed on the lower surface of the drift region 32 to form the drain region 31, and the second metal material is deposited on the drain region 31 to form the drain electrode 2. For the deposition of the first metal material and/or the second metal material, a vapor deposition method or a sputtering method is used for example.

Through the above steps, the semiconductor device 1 according to the first embodiment is manufactured. Note that the above description is merely an example of a method of manufacturing the semiconductor device 1, and the semiconductor device 1 can be manufactured by other methods. For example, the drain region 31 may be formed before the formation of the gate electrode 4.

In the above manufacturing method, the thickness of the portion 5a of the gate insulating film 5 is changed by forming the lower portion of the gate electrode 4 (see FIGS. 6A and 6B), then separately forming the central portion of the gate electrode 4 (see FIGS. 6C to 6E), and finally separately forming the upper portion of the gate electrode 4 (see FIGS. 6F and 6G).

As described above, in the case of the first and second modifications, a part of the above manufacturing method can be omitted or changed. That is, in the first modification, since the widths of the upper portion and the central portion of the gate electrode 4 are constant, the step of separately forming the upper portion of the gate electrode 4 (see FIGS. 6F and 6G) can be omitted. Similarly, in the second modification, since the widths of the lower portion and the central portion of the gate electrode 4 are constant, the step of separately forming the central portion of the gate electrode 4 (see FIGS. 6C to 6E) can be omitted. As described above, in both the first and second modifications, the manufacturing method can be simplified, and cost in manufacturing can be reduced.

Second Embodiment

Figure 7A:
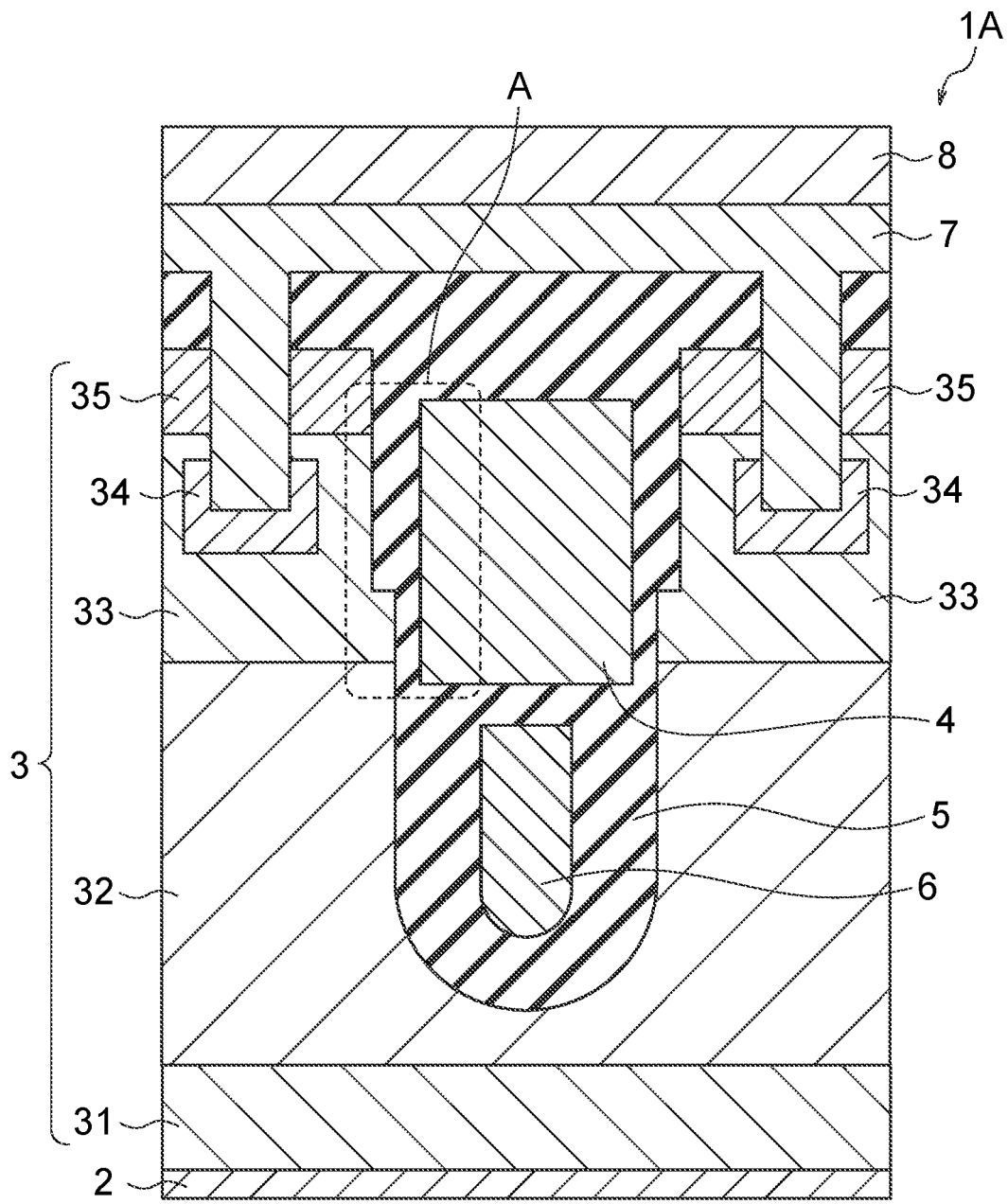
FIG. 7A is a cross-sectional view of a semiconductor device according to a second embodiment.
Figure 7B:
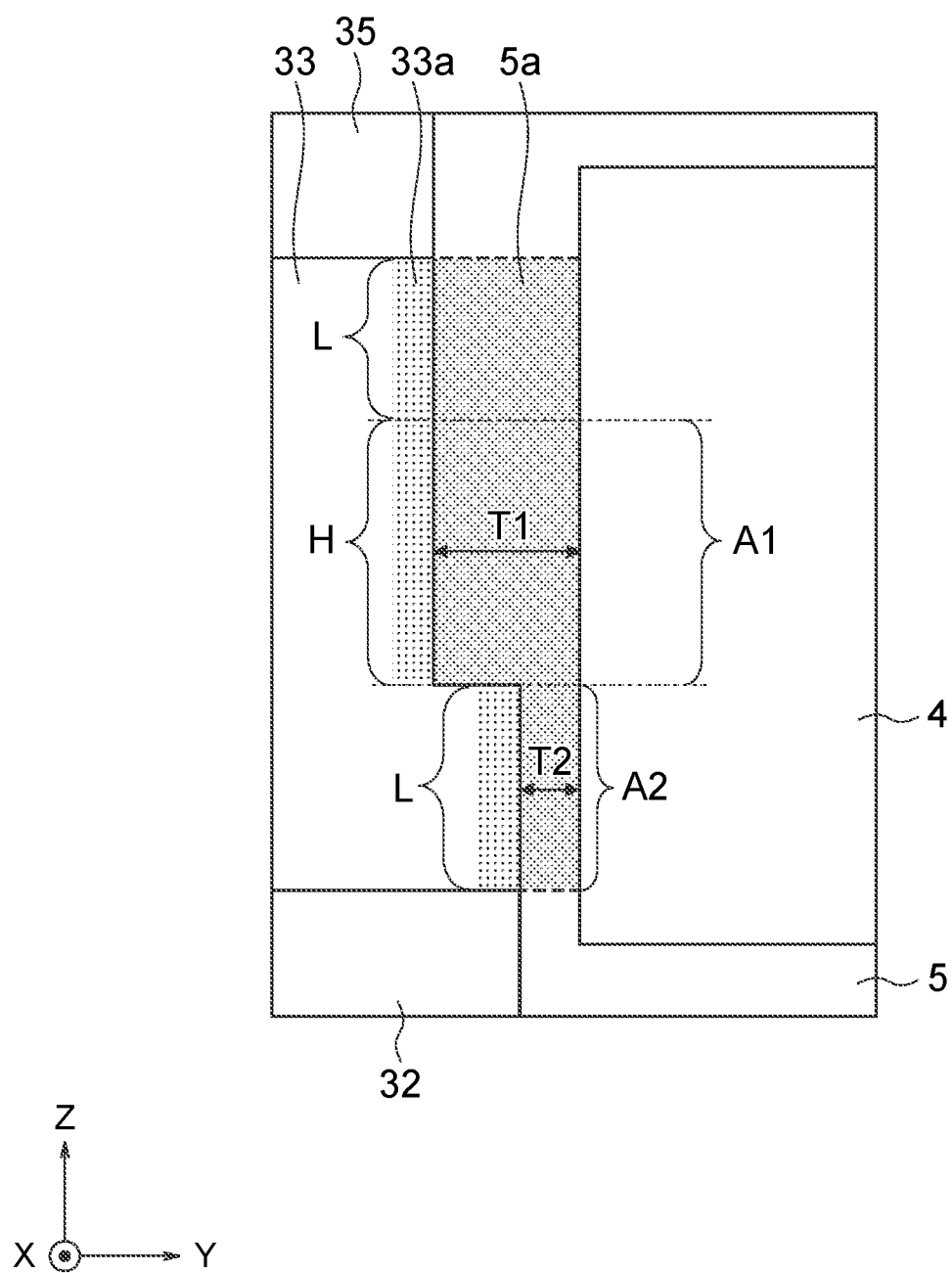
FIG. 7B is a view illustrating the shape of a gate insulating film included in the semiconductor device according to the second embodiment.

Next, a semiconductor device 1A according to a second embodiment will be described with reference to FIGS. 7A and 7B. FIG. 7A is a cross-sectional view of the semiconductor device 1A according to the second embodiment. FIG. 7B is an enlarged view of a region A illustrated in FIG. 7A. In FIGS. 7A and 7B, elements having the same names or functions as those in the drawings described in the above-described embodiment are denoted by the same reference numerals. Hereinafter, the description will be omitted except for the matters changed or added.

In the first embodiment, the shape (width) of the gate electrode 4 is changed in order to change the thickness of the portion 5a of the insulating film 5. On the other hand, in the second embodiment, as illustrated in FIGS. 7A and 7B, the width of a gate electrode 4 is constant, and the thickness of a portion 5a is changed by changing the shape of a semiconductor region 3 instead. Specifically, as illustrated in FIG. 7B, a high-concentration region H is retracted with respect to the gate electrode 4.

In the present embodiment, the region above the high-concentration region H is also retracted with respect to the gate electrode 4. A region A2 is located below a region A1. The region above the region A1 has the same thickness (thickness T1) as the region A1. The arrangement of the region A1 and the region A2 is similar to that of the first modification of the first embodiment. Only the high-concentration region H may be retracted with respect to the gate electrode 4 such that the region A1 and the region A2 are arranged in the same manner as in the first embodiment.

Therefore, also in the second embodiment, the trade-off relationship between the on-resistance Ron and the threshold voltage Vth can be improved similarly to the first embodiment. Also in the present embodiment, since the base length is not changed, the short channel effect can be prevented.

<Method of Manufacturing Semiconductor Device>

Next, an example of a method of manufacturing the semiconductor device 1A according to the second embodiment will be described with reference to FIGS. 8A to 8E. FIGS. 8A to 8E are process cross-sectional views for explaining the method of manufacturing the semiconductor device 1A. Here, steps of forming a gate insulating film 5 will be mainly described, and other steps will be omitted or simplified as appropriate.

Figure 8A:
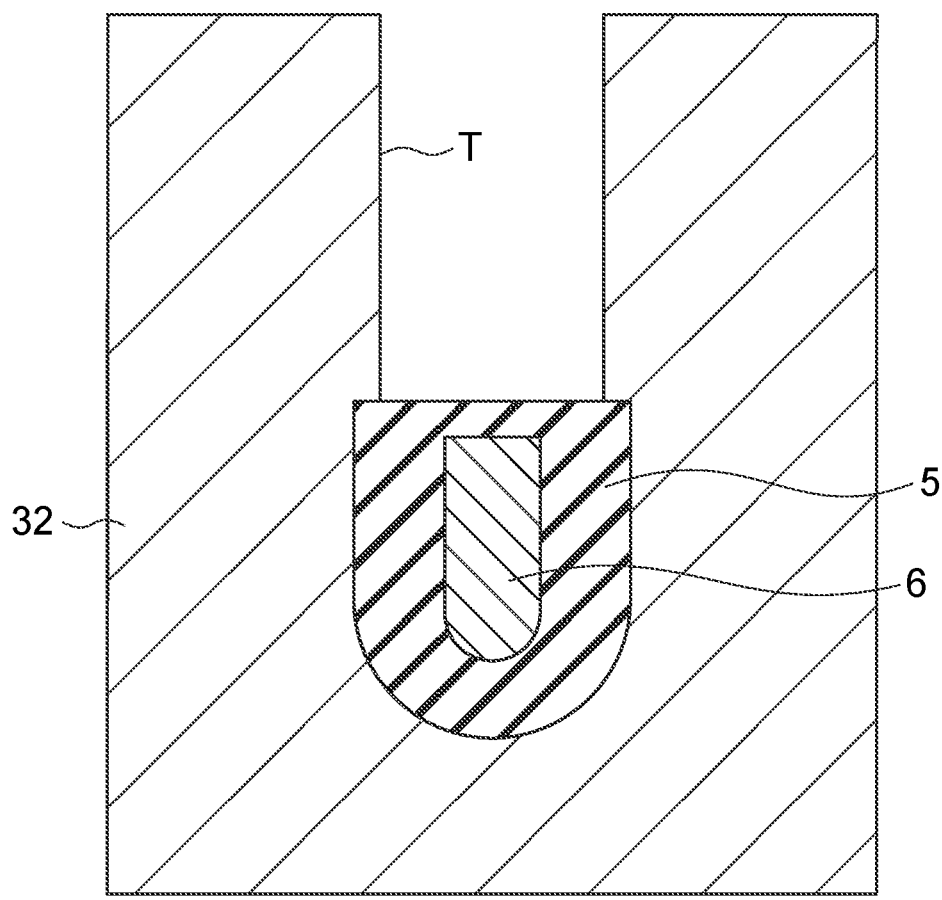
FIG. 8A is a cross-sectional view for explaining an example of a step of the method of manufacturing the semiconductor device according to the second embodiment.

First, as illustrated in FIG. 8A, a trench T is provided in a drift region 32 formed in a semiconductor wafer, and the gate insulating film 5 is disposed in the trench T. The gate insulating film 5 is made of, for example, silicon oxide. In the present embodiment, the FP electrode 6 is buried in the gate insulating film 5, but the FP electrode 6 may not be provided.

Figure 8B:
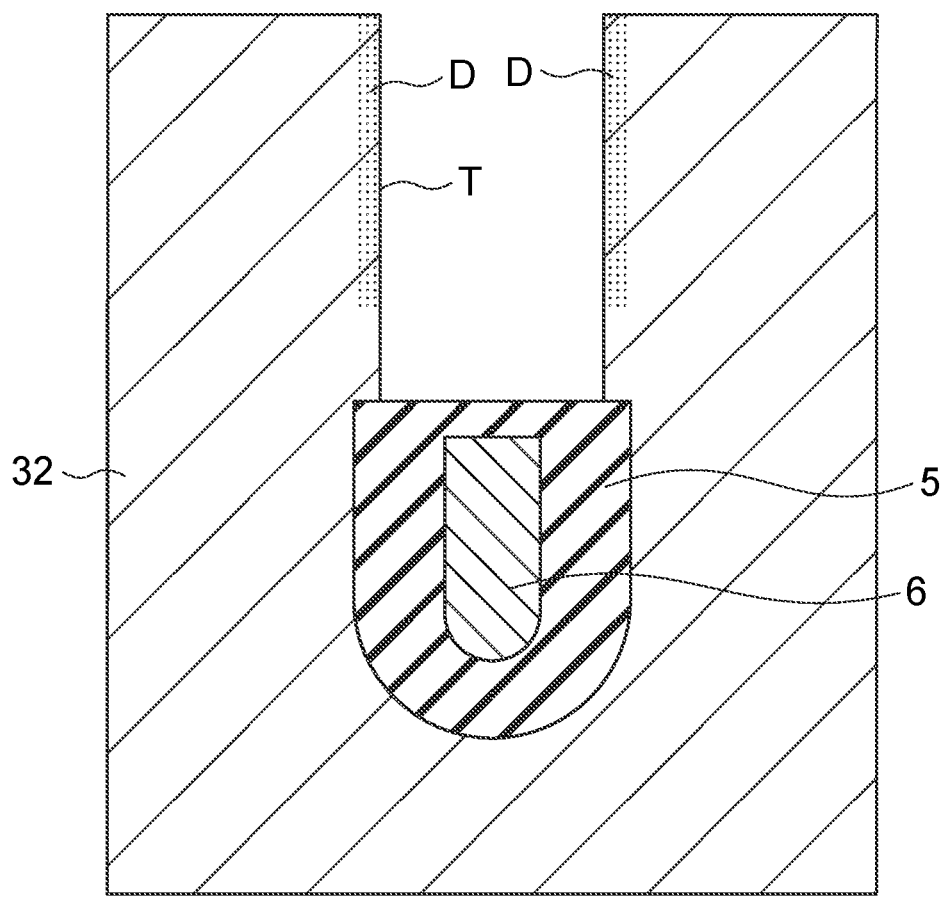
FIG. 8B is a cross-sectional view for explaining an example of a step of the method of manufacturing the semiconductor device according to the second embodiment, following FIG. 8A.

Next, as illustrated in FIG. 8B, for example, argon is ion-implanted into the upper portion of the trench T, thereby imparting ion implantation damage. As a result, a damaged portion D is formed.

Figure 8C:
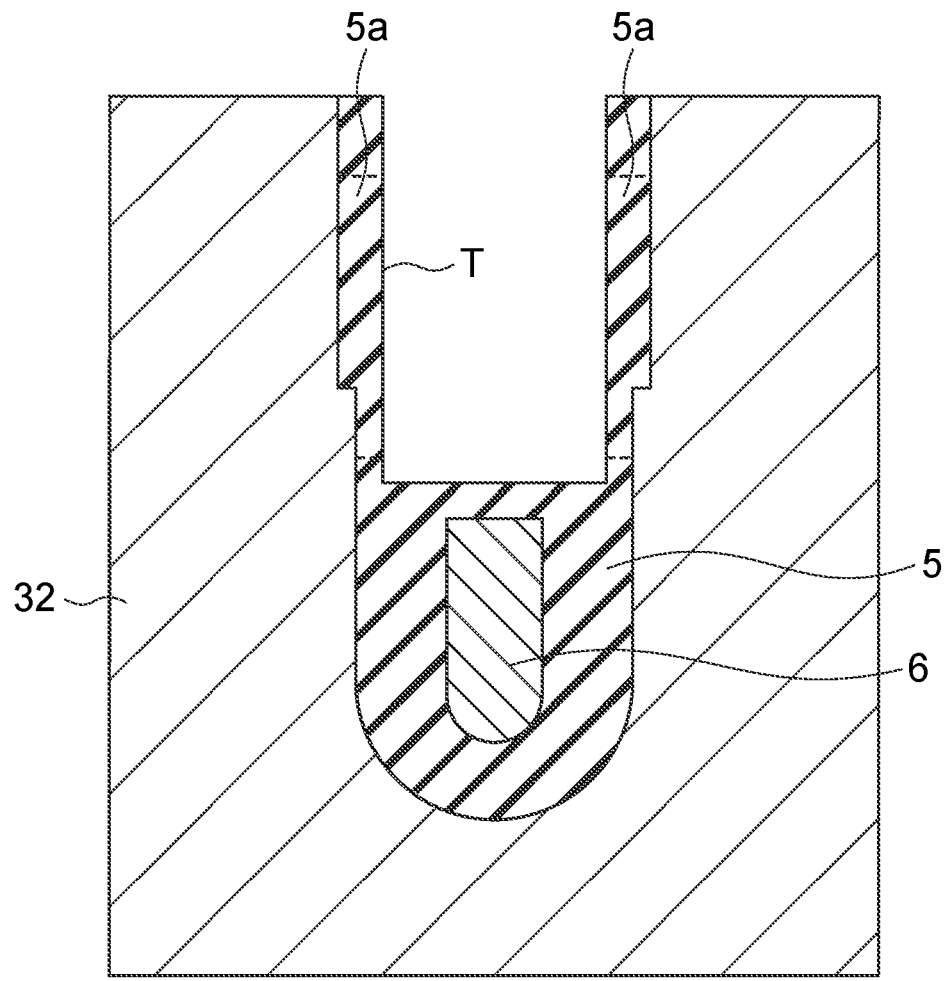
FIG. 8C is a cross-sectional view for explaining an example of a step of the method of manufacturing the semiconductor device according to the second embodiment, following FIG. 8B.

Next, as illustrated in FIG. 8C, the inside of the trench T is thermally oxidized. At this time, the damaged portion D has a high oxidation speed and is further oxidized to the inside. Through this step, the final shape of the portion 5a is determined. As a result, in a subsequent step, a base region 33 is formed such that the high-concentration region H is adjacent to a region where the thickness of the portion 5a is large, whereby the high-concentration region H can be retracted with respect to the gate electrode 4.

Figure 8D:
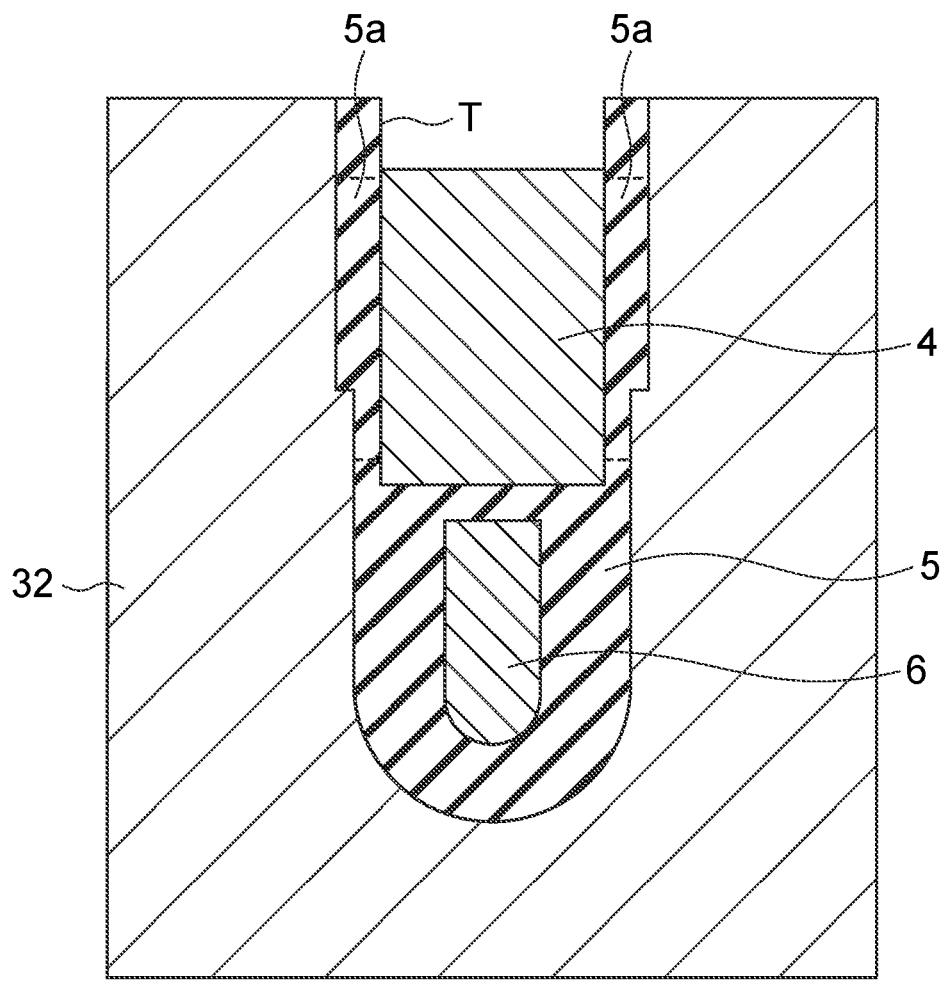
FIG. 8D is a cross-sectional view for explaining an example of a step of the method of manufacturing the semiconductor device according to the second embodiment, following FIG. 8C.

Next, as illustrated in FIG. 8D, the gate electrode 4 is formed in the trench T. The gate electrode 4 is formed, for example, by depositing a conductive material such as polysilicon so as to fill the inside of the trench T and then etching back the excessive conductive material.

Thereafter, similarly to the method of manufacturing the semiconductor device 1 according to the first embodiment, the base region 33, a source region 35, the gate insulating film 5, a contact region 34, a barrier metal 7, a source electrode 8, a drain region 31, and a drain electrode 2 are formed.

Through the above steps, the semiconductor device 1A according to the second embodiment is manufactured. Note that the above description is merely an example of a method of manufacturing the semiconductor device 1A, and the semiconductor device 1A can be manufactured by other methods. For example, after the inner wall of the trench is thermally oxidized, the trench may be vertically dug down by RIE or the like, and the inner wall of the trench may be thermally oxidized again. As a result, the oxide film (insulating film) is thicker in the portion thermally oxidized twice (the upper portion of the trench) than in the portion thermally oxidized once (the lower portion of the trench). Therefore, in a subsequent step, the base region 33 (including the high-concentration region H) adjacent to the portion thermally oxidized twice can be retracted with respect to the gate electrode 4.

Third Embodiment

Figure 9A:
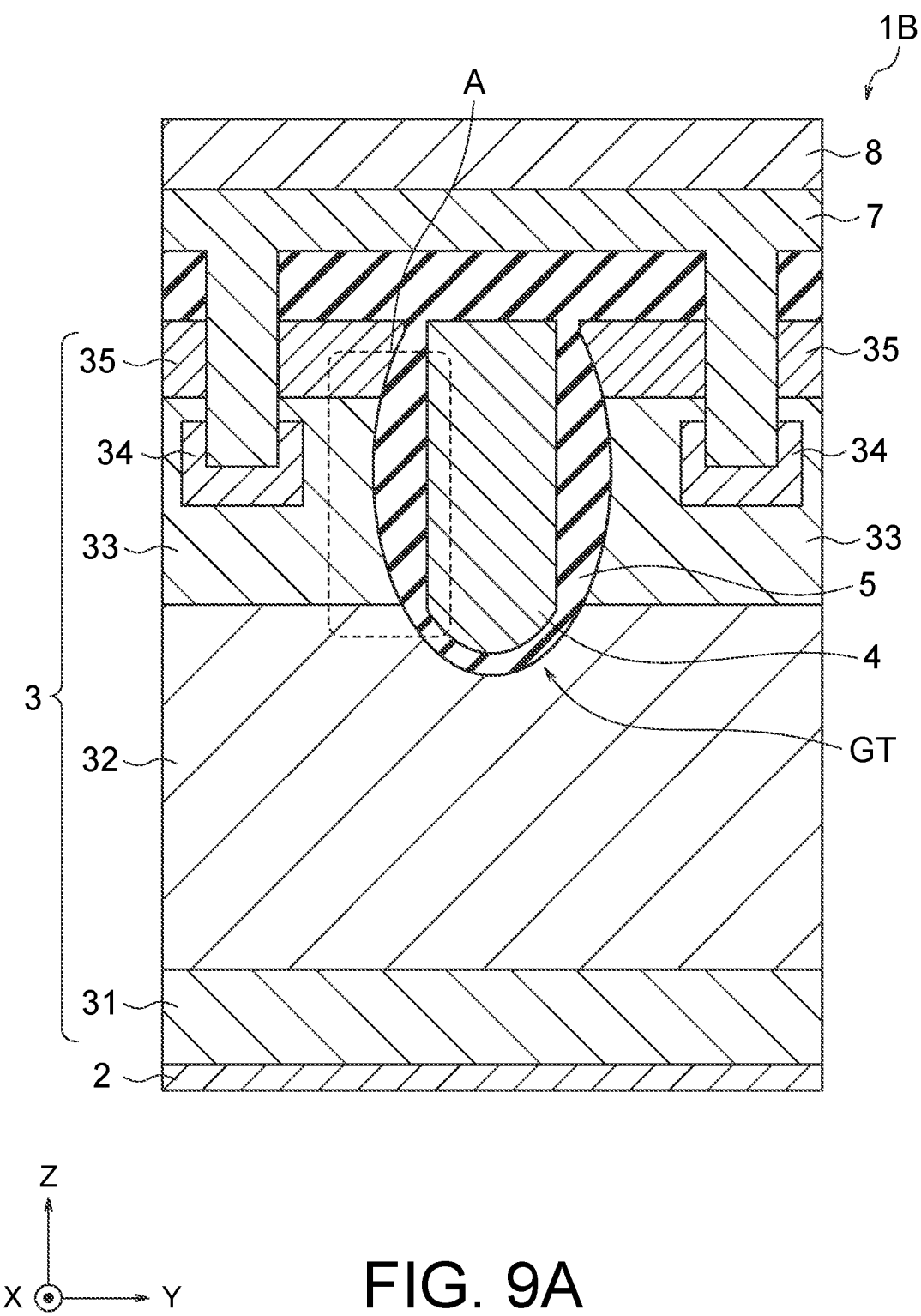
FIG. 9A is a cross-sectional view of a semiconductor device according to a third embodiment.
Figure 9B:
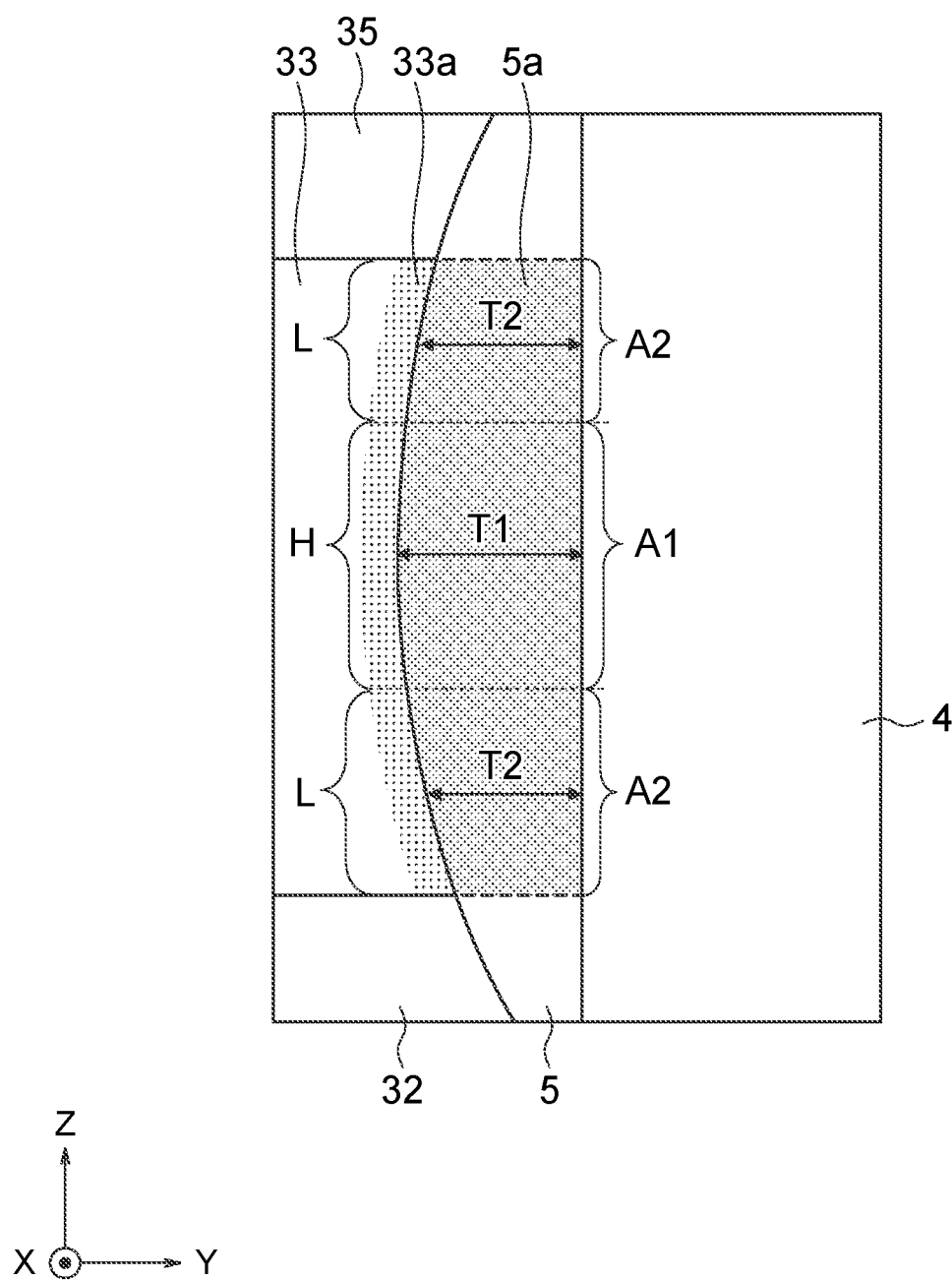
FIG. 9B is a view illustrating the shape of a gate insulating film included in the semiconductor device according to the third embodiment.

Next, a semiconductor device 1B according to a third embodiment will be described with reference to FIGS. 9A and 9B. FIG. 9A is a cross-sectional view of the semiconductor device 1B according to the third embodiment. FIG. 9B is an enlarged view of a region A illustrated in FIG. 9A. In FIGS. 9A and 9B, elements having the same names or functions as those in the drawings described in the above-described embodiments are denoted by the same reference numerals. Hereinafter, the description will be omitted except for the matters changed or added.

In the first embodiment and the second embodiment, the thickness of the portion 5a of the insulating film 5 is discontinuously changed. That is, the thickness changed discontinuously at the boundary between the region A1 and the region A2. In addition, the thickness T1 was constant in the region A1, and the thickness T2 was constant in the region A2. In the present embodiment, the thickness of a gate insulating film 5 continuously changes. That is, the thickness continuously changes at the boundary between a region A1 and a region A2, and the thickness is not constant in the region A1 and the region A2.

In the present embodiment, as illustrated in FIG. 9A, a gate trench GT having a bowing-shaped cross section is provided. The gate trench GT extends from a source region 35 through a base region 33 to a drift region 32. The gate insulating film 5 fills the gate trench GT. A gate electrode 4 is disposed in the gate insulating film 5. The gate electrode 4 has a constant width (size in the Y-axis direction). As described above, in the third embodiment, the thickness (width) of the gate electrode 4 is constant, and the gate trench GT has the bowing shaped cross section, so that the thickness of a portion 5a continuously changes as illustrated in FIG. 9B.

Even if the thickness of the portion 5a of the insulating film 5 continuously changes as in the present embodiment, since the thickness of the region A1 in contact with a high-concentration region H is larger than the thickness of the region A2 in contact with a low-concentration region L, the trade-off relationship between the on-resistance Ron and the threshold voltage Vth can be improved. Also in the present embodiment, since the base length is not changed, the short channel effect can be prevented.

Thicknesses T1 and T2 may be thicknesses of the thickest portions of the regions A1 and A2, respectively, or may be average values of the thicknesses.

In the first embodiment and the second embodiment, it is necessary to perform separate steps in order to discontinuously change the thickness of the portion 5a, that is, to form the region A1 and the region A2. Therefore, the number of steps is relatively large in the manufacturing method. On the other hand, in the third embodiment, the thickness of the portion 5a of the insulating film 5 can be continuously changed by using the bowing-shaped gate trench GT. Therefore, the region A1 in contact with the high-concentration region H and the region A2 in contact with the low-concentration region L can be formed in one step. As a result, the number of manufacturing steps of the semiconductor device 1B can be reduced, and cost can be reduced.

<Method of Manufacturing Semiconductor Device>

An example of a method of manufacturing the semiconductor device 1B will be described with reference to FIGS. 10A to 10F. FIGS. 10A to 10F are process cross-sectional views for explaining the method of manufacturing the semiconductor device 1B. Here, steps of manufacturing the gate insulating film 5 will be mainly described, and other steps will be omitted or simplified as appropriate.

Figure 10A:
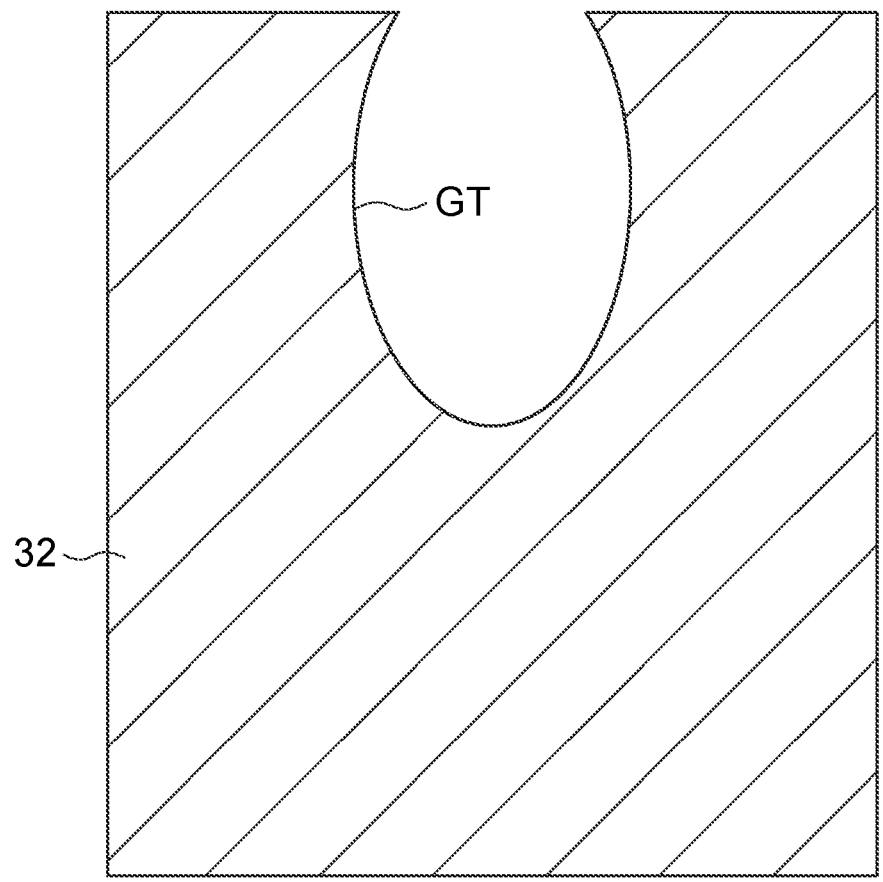
FIG. 10A is a cross-sectional view for explaining an example of a step of the method of manufacturing the semiconductor device according to the third embodiment.

First, as illustrated in FIG. 10A, the gate trench GT having a bowing-shaped cross section is provided in the drift region 32 formed on a semiconductor wafer. When the drift region 32 is etched by, for example, RIE, various conditions such as the gas flow rate are adjusted, so that the gate trench GT having a bowing-shaped cross section can be formed with good reproducibility.

Figure 10B:
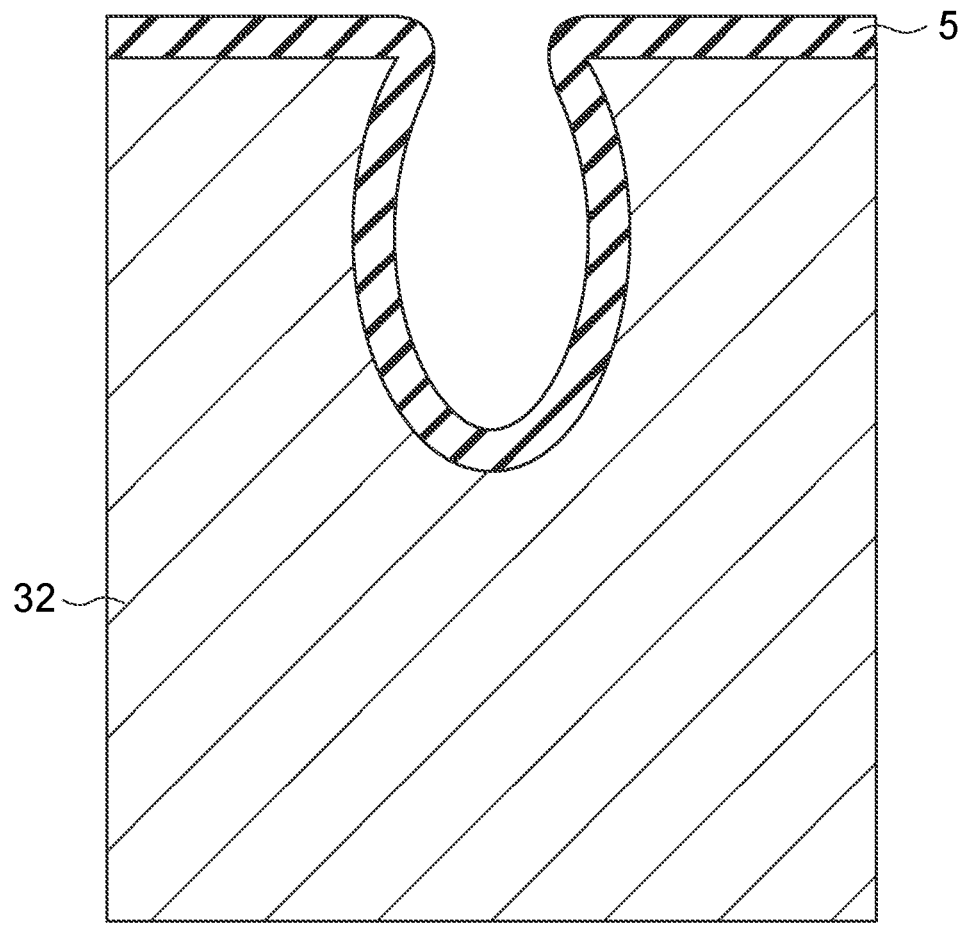
FIG. 10B is a cross-sectional view for explaining an example of a step of the method of manufacturing the semiconductor device according to the third embodiment, following FIG. 10A.

Next, as illustrated in FIG. 10B, an insulating material is deposited on the inner wall of the gate trench GT and the drift region 32 by a method such as PVD or CVD to form the gate insulating film 5.

Figure 10C:
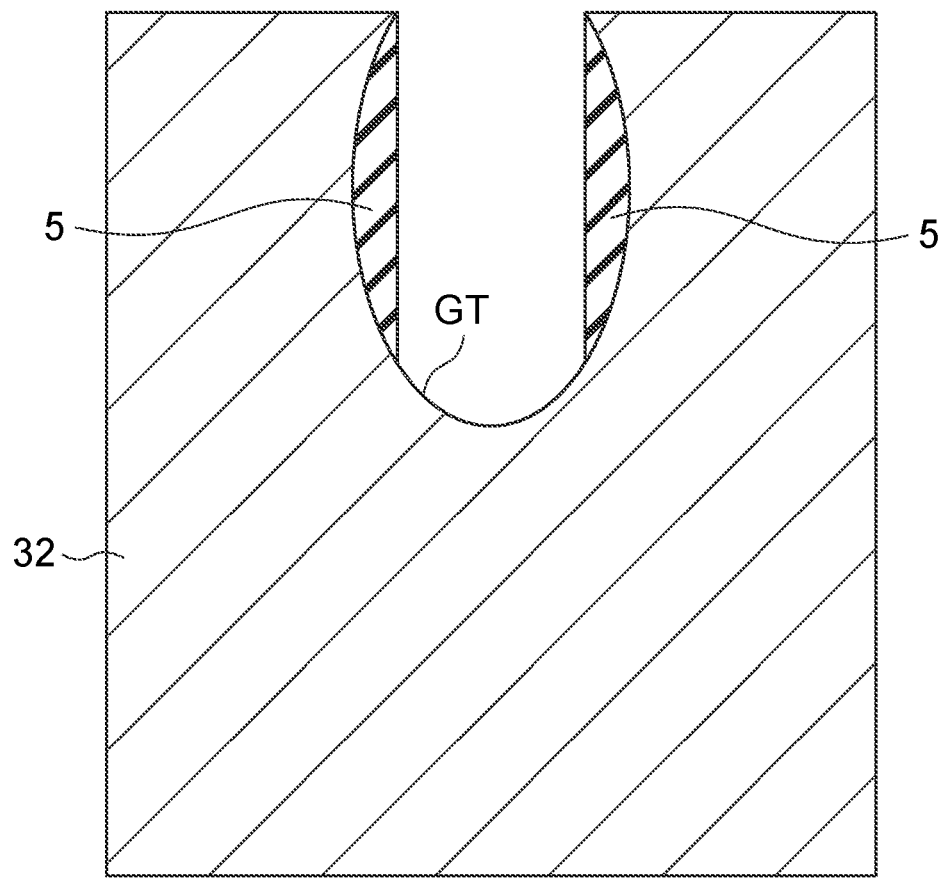
FIG. 10C is a cross-sectional view for explaining an example of a step of the method of manufacturing the semiconductor device according to the third embodiment, following FIG. 10B.

Next, as illustrated in FIG. 10C, a part of the gate insulating film 5 is removed by anisotropic etching such as RIE. At this time, when the drift region 32 is viewed in the thickness direction (Z-axis direction), the gate insulating film 5 is removed except for a portion having a cross-sectional area wider than the opening of the gate trench GT. At this time, the remaining gate insulating film 5 has an arcuate cross section, so that the thickness of the portion 5a continuously changes. As a result, when the base region 33 is formed in a subsequent step, the region A1 in contact with the high-concentration region H and the region A2 in contact with the low-concentration region L have different thicknesses.

Figure 10D:
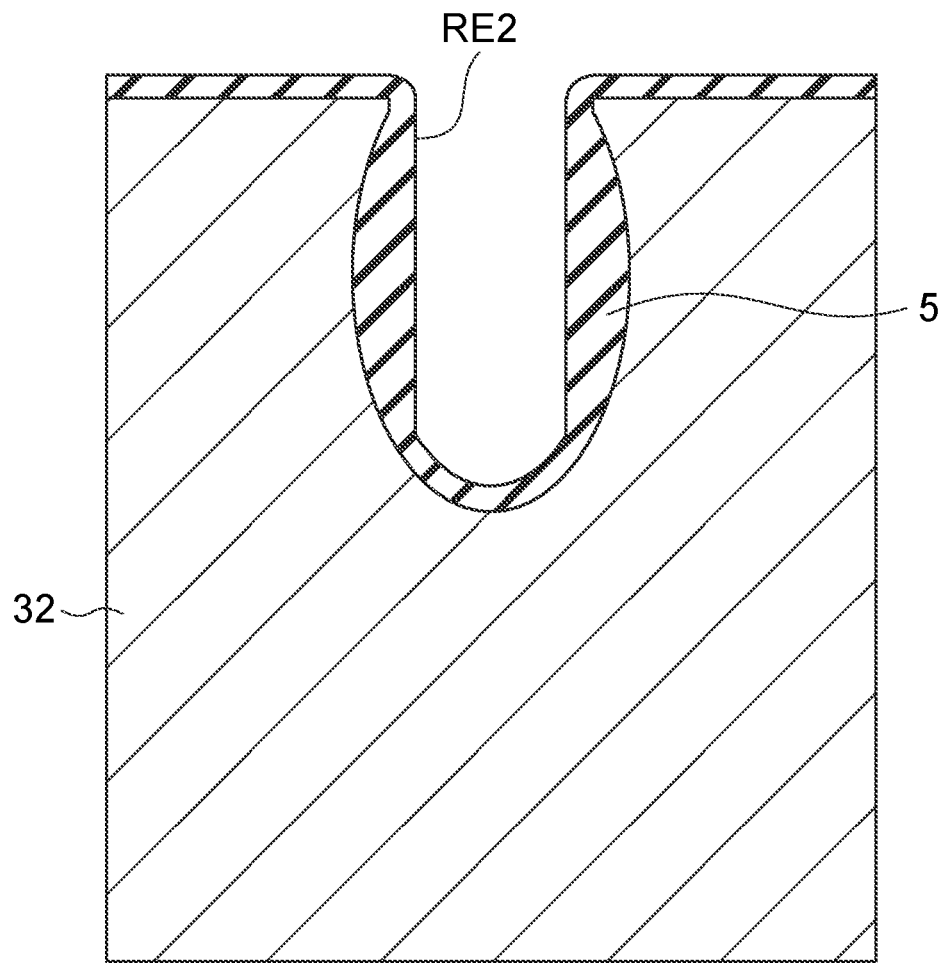
FIG. 10D is a cross-sectional view for explaining an example of a step of the method of manufacturing the semiconductor device according to the third embodiment, following FIG. 10C.

Next, as illustrated in FIG. 10D, an insulating material is deposited on the inner wall of the gate trench GT, the gate insulating film 5, and the drift region 32 by a method such as PVD or CVD to thicken the gate insulating film 5. As a result, a recess RE2 is formed.

Figure 10E:
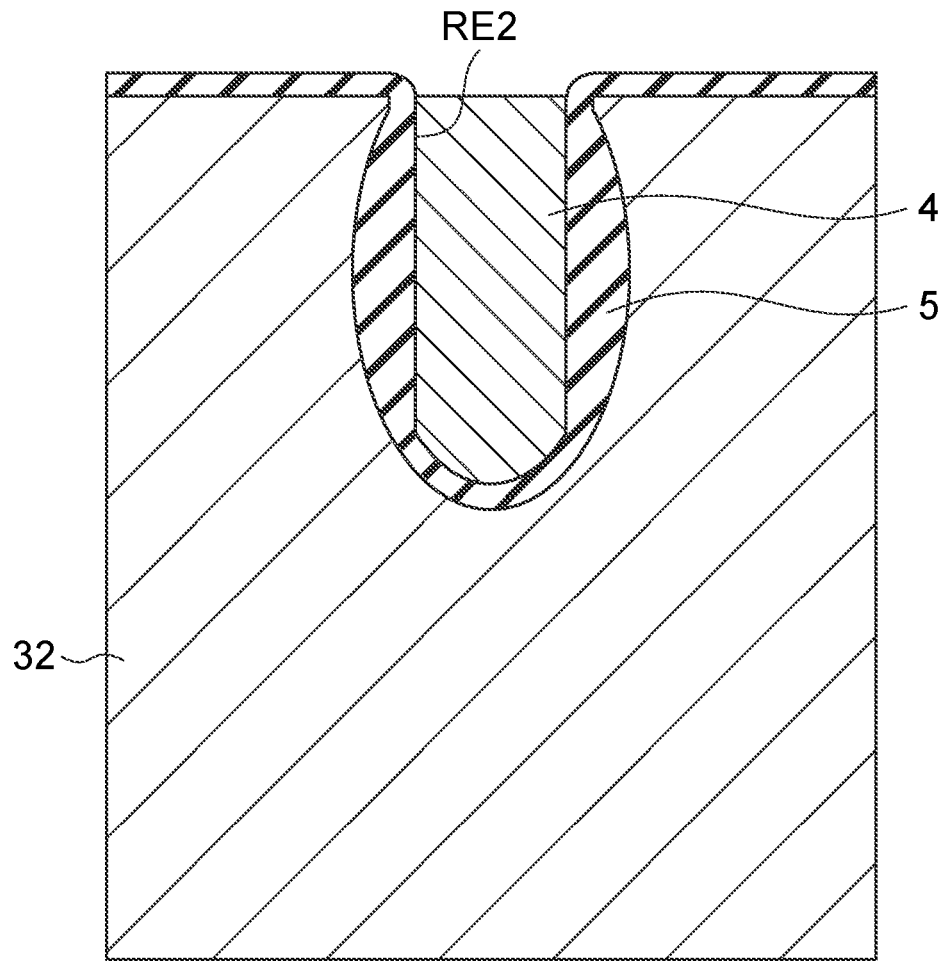
FIG. 10E is a cross-sectional view for explaining an example of a step of the method of manufacturing the semiconductor device according to the third embodiment, following FIG. 10D.

Next, as illustrated in FIG. 10E, the gate electrode 4 is formed in the recess RE2. The gate electrode 4 is formed, for example, by laminating a conductive material such as polysilicon so as to fill the inside of the recess RE2 and then etching back the excessive conductive material.

Thereafter, similarly to the method of manufacturing the semiconductor device 1 according to the first embodiment, the base region 33, a source region 35, the gate insulating film 5, a contact region 34, a barrier metal 7, a source electrode 8, a drain region 31, and a drain electrode 2 are formed.

Through the above steps, the semiconductor device 1B according to the third embodiment is manufactured. Note that the above description is merely an example of a method of manufacturing the semiconductor device 1B, and the semiconductor device 1B can be manufactured by other methods.

According to the present manufacturing method, since the insulating film 5 including the region A1 and the region A2 can be formed in one step, the manufacturing method can be simplified, and the manufacturing cost can be reduced.

Fourth Embodiment

Figure 11A:
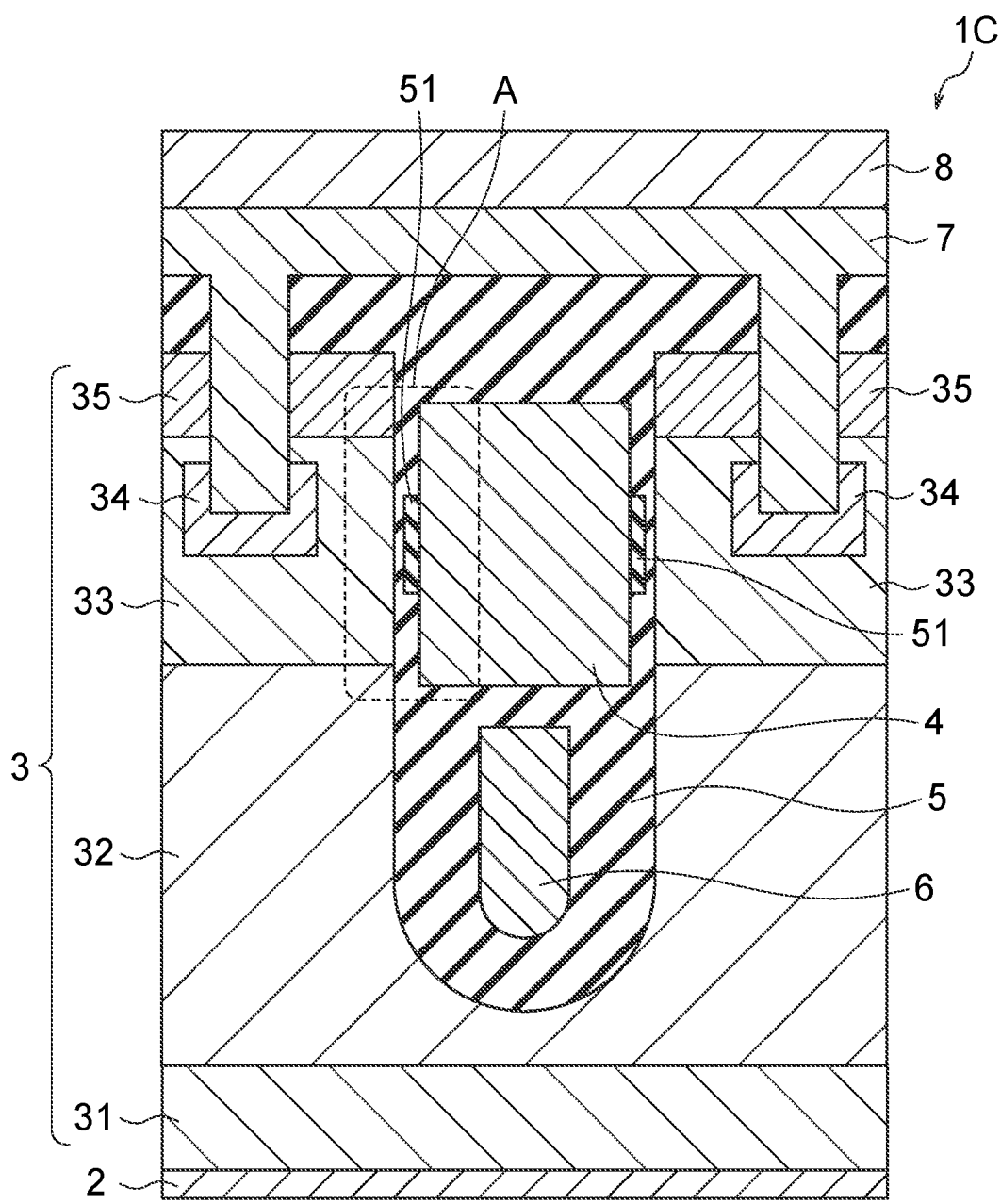
FIG. 11A is a cross-sectional view of a semiconductor device according to a fourth embodiment.
Figure 11B:
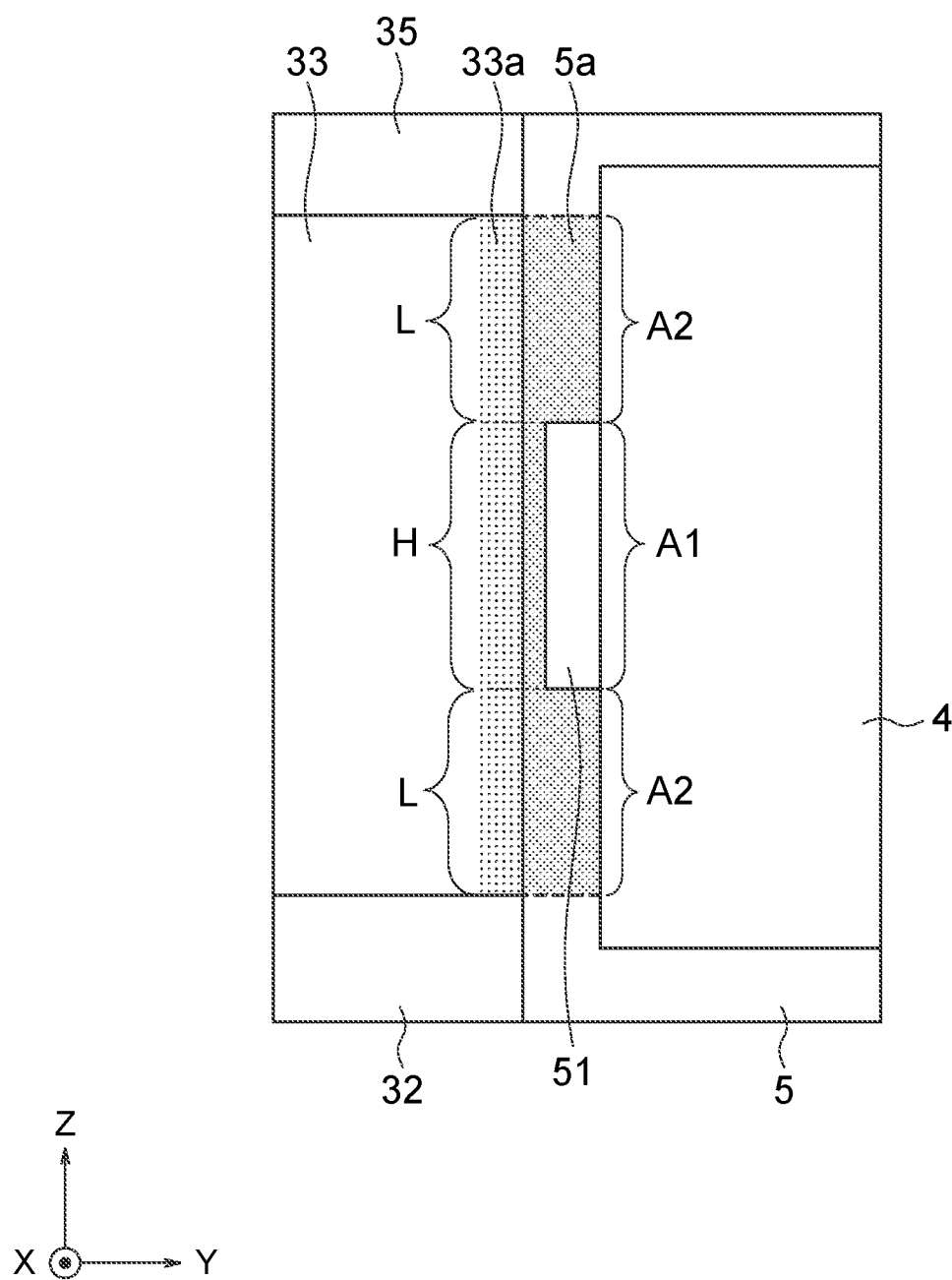
FIG. 11B is a view illustrating the shape of a gate insulating film included in the semiconductor device according to the fourth embodiment.

Next, a semiconductor device 1C according to a fourth embodiment will be described with reference to FIGS. 11A and 11B. FIG. 11A is a cross-sectional view of the semiconductor device 1C. FIG. 11B is an enlarged view of a region A illustrated in FIG. 11A. In FIGS. 11A and 11B, elements having the same names or functions as those in the drawings described in the above-described embodiments are denoted by the same reference numerals. Hereinafter, the description will be omitted except for the matters changed or added.

In the first, second, and third embodiments, the trade-off relationship between the on-resistance Ron and the threshold voltage Vth is improved by changing the film thickness of the gate insulating film 5. On the other hand, in the present embodiment, the trade-off relationship between the on-resistance Ron and the threshold voltage Vth is improved by replacing a part of a portion 5a with a low dielectric constant portion 51 having a dielectric constant lower than that of a gate insulating film 5.

As illustrated in FIG. 11B, the gate insulating film 5 includes the low dielectric constant portion 51 in a region A1. In other words, the low dielectric constant portion 51 is disposed in a part or the whole of the region A1. The dielectric constant of the low dielectric constant portion 51 is lower than the dielectric constant of the gate insulating film 5. As a result, the dielectric constant of a region A2 becomes higher than that of the region A1, and it is possible to obtain the same effect as the case where the region A2 is made thinner than the region A1 without changing the thicknesses of the region A1 and the region A2. Therefore, in the present embodiment, the width of a gate electrode 4 is constant, and a high-concentration region H is not retracted with respect to the gate electrode 4.

The low dielectric constant portion 51 is made of, for example, a low-k material such as fluorine-doped silicon oxide (SiOF). When the gate insulating film 5 is made of silicon oxide, for example, fluorine is added to a part of the gate insulating film 5 to form the low dielectric constant portion 51 made of SiOF.

As described above, in the fourth embodiment, by disposing the insulating film portion 51 having a dielectric constant lower than that of the gate insulating film 5 in a part or the whole of the region A1 in contact with the high-concentration region H of a base region 33, the trade-off relationship between the on-resistance Ron and the threshold voltage Vth can be improved without changing the physical thickness of the portion 5a. Also in the present embodiment, since the base length is not changed, the short channel effect can be prevented.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first electrode;
a first semiconductor region of a first conductivity type disposed above the first electrode;
a second semiconductor region of a second conductivity type disposed on the first semiconductor region;
a third semiconductor region of the first conductivity type disposed on the second semiconductor region;
an insulating film disposed in the first semiconductor region, the second semiconductor region, and the third semiconductor region;
a second electrode disposed in the insulating film so as to be adjacent to the second semiconductor region via the insulating film; and
a third electrode electrically connected to the third semiconductor region; wherein
the second semiconductor region includes a boundary region that is in contact with the insulating film and faces the second electrode,
the boundary region of the second semiconductor region has a high-concentration region including a peak of an impurity concentration of the second conductivity type,
the insulating film includes a first region in contact with the high-concentration region of the boundary region and a second region in contact with a low-concentration region of the boundary region, the low-concentration region being different from the high-concentration region, and
a thickness of the second region is smaller than a thickness of the first region.

2. The semiconductor device according to claim 1, wherein
the high-concentration region is a region where the impurity concentration is equal to or higher than a predetermined ratio of a value at the peak.

3. The semiconductor device according to claim 2, wherein
the predetermined ratio is 0.7 or more and 0.95 or less.

4. The semiconductor device according to claim 1, wherein
the first, second, and third semiconductor regions contain silicon, silicon carbide, or gallium nitride, and the insulating film contains silicon oxide or silicon nitride.

5. The semiconductor device according to claim 1, wherein
the second region of the insulating film is a region of the insulating film excluding the first region from a portion sandwiched between the second electrode and the second semiconductor region.

6. The semiconductor device according to claim 1, wherein
the second electrode includes a first partial electrode and a second partial electrode disposed apart from each other, and
the first partial electrode is adjacent to the high-concentration region via the first region, and the second partial electrode is adjacent to the low-concentration region via the second region.

7. The semiconductor device according to claim 1, wherein
a width of the second electrode is constant, and
the high-concentration region is retracted with respect to the second electrode.

8. The semiconductor device according to claim 1, wherein
a width of the second electrode is constant, and
the insulating film fills a trench having a bowing-shaped cross section.

9. The semiconductor device according to claim 1, further comprising
a fourth semiconductor region of the first conductivity type disposed between the first electrode and the first semiconductor region, wherein
the semiconductor device is configured as a vertical MOSFET.

10. The semiconductor device according to claim 9, further comprising
a fourth electrode disposed below the second electrode in the insulating film, the fourth electrode being electrically connected to the third electrode.

11. The semiconductor device according to claim 1, further comprising
a fifth semiconductor region of the second conductivity type disposed between the first electrode and the first semiconductor region, wherein
the semiconductor device is configured as an insulated gate bipolar transistor.

12. A semiconductor device comprising:
a first electrode;
a first semiconductor region of a first conductivity type disposed above the first electrode;
a second semiconductor region of a second conductivity type disposed on the first semiconductor region;
a third semiconductor region of the first conductivity type disposed on the second semiconductor region;
an insulating film disposed in the first semiconductor region, the second semiconductor region, and the third semiconductor region;
a second electrode disposed in the insulating film; and
a third electrode electrically connected to the third semiconductor region; wherein
the second semiconductor region includes a boundary region that is in contact with the insulating film and faces the second electrode,
the boundary region of the second semiconductor region has a high-concentration region including a peak of an impurity concentration of the second conductivity type,
the insulating film includes a first region in contact with the high-concentration region of the boundary region and a second region in contact with a region different from the high-concentration region of the boundary region, and
a low dielectric constant portion having a dielectric constant smaller than that of the insulating film is disposed in the first region.

13. The semiconductor device according to claim 12, wherein
the high-concentration region is a region where the impurity concentration is equal to or higher than a predetermined ratio of a value at the peak.

14. The semiconductor device according to claim 13, wherein
the predetermined ratio is 0.7 or more and 0.95 or less.

15. The semiconductor device according to claim 12, wherein the first, second, and third semiconductor regions contain silicon, silicon carbide, or gallium nitride, and the insulating film contains silicon oxide or silicon nitride.

16. The semiconductor device according to claim 12, wherein
 a width of the second electrode is constant, and the high-concentration region is not retracted with respect to the second electrode.

17. The semiconductor device according to claim 12, further comprising
 a fourth semiconductor region of the first conductivity type disposed between the first electrode and the first semiconductor region, wherein
 the semiconductor device is configured as a vertical MOSFET.

18. The semiconductor device according to claim 17, further comprising
 a fourth electrode disposed below the second electrode in the insulating film, the fourth electrode being electrically connected to the third electrode.

19. The semiconductor device according to claim 12, further comprising
 a fifth semiconductor region of the second conductivity type disposed between the first electrode and the first semiconductor region, wherein
 the semiconductor device is configured as an insulated gate bipolar transistor.

* * * * *